(12) United States Patent
Tavallaee et al.

(10) Patent No.: US 12,066,577 B2
(45) Date of Patent: Aug. 20, 2024

(54) REDUCING AMPLITUDE VARIATIONS IN LIDAR SYSTEM OUTPUT SIGNALS

(71) Applicant: SiLC Technologies, Inc., Monrovia, CA (US)

(72) Inventors: Amir Ali Tavallaee, San Francisco, CA (US); Behnam Behroozpour, South San Francisco, CA (US); Mehdi Asghari, La Canada Flintridge, CA (US)

(73) Assignee: SiLC Technologies, Inc., Monrovia, CA (US)

( * ) Notice: Subject to any disclaimer, the term of this patent is extended or adjusted under 35 U.S.C. 154(b) by 168 days.

(21) Appl. No.: 16/870,890

(22) Filed: May 8, 2020

(65) Prior Publication Data
US 2021/0349197 A1 Nov. 11, 2021

(51) Int. Cl.
*G01C 3/08* (2006.01)
*G01S 7/481* (2006.01)
*G01S 7/4911* (2020.01)
*G01S 7/4912* (2020.01)

(52) U.S. Cl.
CPC ........... *G01S 7/4911* (2013.01); *G01S 7/4813* (2013.01); *G01S 7/4917* (2013.01)

(58) Field of Classification Search
None
See application file for complete search history.

(56) References Cited

U.S. PATENT DOCUMENTS

| | | | | |
|---|---|---|---|---|
| 5,847,816 A | * | 12/1998 | Zediker | G01S 7/4917 356/28.5 |
| 2009/0046746 A1 | | 2/2009 | Munroe et al. | |
| 2010/0277714 A1 | | 11/2010 | Pedersen et al. | |
| 2015/0177367 A1 | * | 6/2015 | Sebastian | G01S 7/4814 356/5.09 |
| 2017/0371227 A1 | * | 12/2017 | Skirlo | G02F 1/2955 |
| 2019/0302262 A1 | | 10/2019 | Singer | |
| 2019/0353789 A1 | | 11/2019 | Boloorian et al. | |
| 2020/0021082 A1 | * | 1/2020 | Rakuljic | H01S 5/0261 |
| 2020/0072978 A1 | | 3/2020 | Boloorian et al. | |
| 2020/0110179 A1 | | 4/2020 | Talty et al. | |

OTHER PUBLICATIONS

Baghmisheh, B. B., "Chip-scale Lidar", 2017, University of California, Berkeley.
Ssakov, V. "Radar Systems, Ch. 2. In Microwave Circuits for 24GHz Automotive Radar in Silicon-based Technologies", 2010, Berlin Heidelberg: Springer-Verlag.

(Continued)

*Primary Examiner* — Mark Hellner
(74) *Attorney, Agent, or Firm* — Gavrilovich, Dodd & Lindsey LLP

(57) ABSTRACT

A LIDAR system has multiple optical components. At least one of the optical components is configured to output a LIDAR output signal that travels away from the LIDAR system and can be reflected by an object located outside of the LIDAR system. The LIDAR system also includes electronics configured to operate one or more of the optical components so as to tune the frequency of the LIDAR output signal without changing an amplitude of the LIDAR output signal.

20 Claims, 11 Drawing Sheets

(56) References Cited

OTHER PUBLICATIONS

Li, L., "Time-of-Flight Camera—An Introduction", 2014, TI Technical White Paper SLOA190B.
Kim, Harry, International Search Report and Written Opinion, PCT/US2021/030963, International Searching Authority, United States Patent and Trademark Office, Sep. 14, 2021.
Baharlou, Simin, International Preliminary Report on Patentability and Written Opinion, PCT/US2021/030963, The International Bureau of WIPO, Nov. 14, 2022.

* cited by examiner

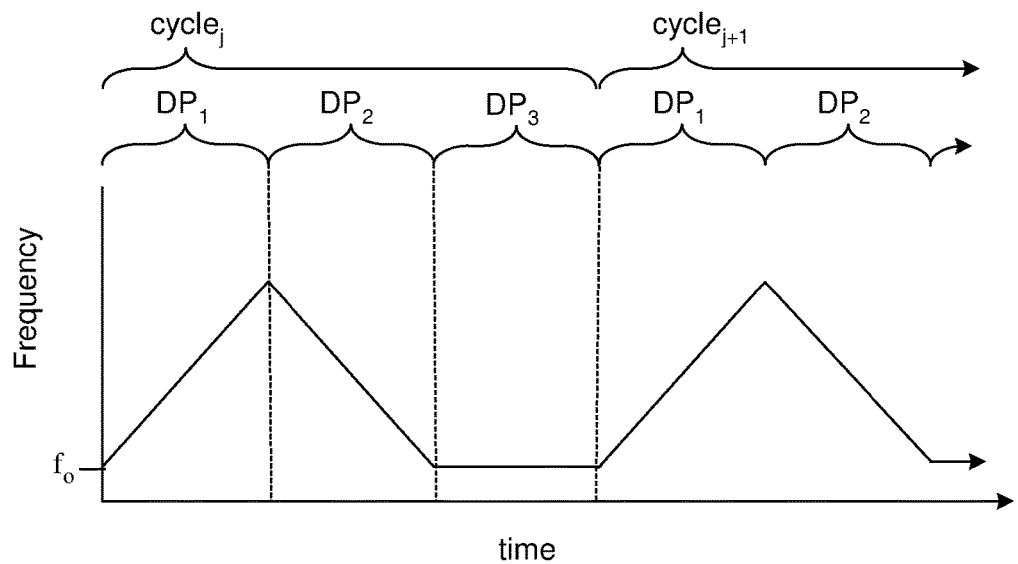
Figure 5C
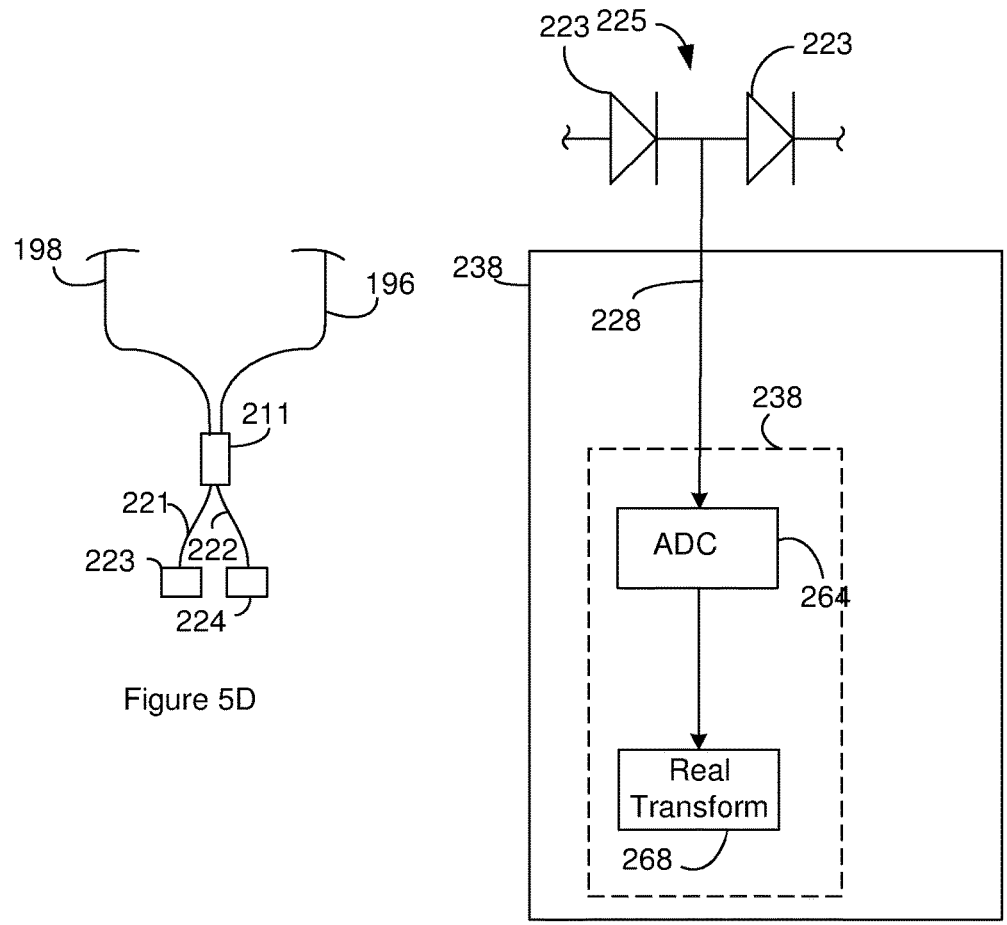
Figure 5D
Figure 5E

US 12,066,577 B2

REDUCING AMPLITUDE VARIATIONS IN LIDAR SYSTEM OUTPUT SIGNALS

FIELD

The invention relates to optical devices. In particular, the invention relates to LIDAR systems.

BACKGROUND

There is an increasing commercial demand for LIDAR systems that can be deployed in applications such as ADAS (Advanced Driver Assistance Systems) and AR (Augmented Reality). LIDAR (Light Detection and Ranging) systems typically output a system output signal that is reflected by an object located outside of the LIDAR system. At least a portion of the reflected light signal returns to the LIDAR system. The LIDAR system directs the received light signal to a light sensor that converts the light signal to an electrical sensor. Electronics can use the light sensor output to quantify LIDAR data that indicates the radial velocity and/or distance between the object and the LIDAR system (LIDAR data).

Many LIDAR systems tune the frequency of the system output signal during the measurement of LIDAR data. The variations in the frequency of the system output signals causes a variation in the amplitude of the system output signals. This variation in amplitude can reduce the reliability of the LIDAR data results. As a result, there is a need for LIDAR systems with more reliable LIDAR data results.

SUMMARY

The LIDAR system has multiple optical components. At least one of the optical components is configured to output a system output signal that travels away from the LIDAR system and can be reflected by an object located outside of the LIDAR system. The LIDAR system also includes electronics configured to operate one or more of the optical components so as to tune the frequency of the system output signal without changing an amplitude of the system output signal.

Another embodiment of a LIDAR system includes one or more optical components configured to output a system output signal that travels away from the LIDAR system and can be reflected by an object located outside of the LIDAR system. The LIDAR system includes an amplifier that receives a pre-amplifier signal and outputs an amplified light signal. The system output signal includes light from the amplified light signal. Electronics are configured to operate the amplifier in a saturated state during a period of time in which the amplifier outputs the amplified light signal.

BRIEF DESCRIPTION OF THE FIGURES

FIG. 5C is a graph of frequency versus time for a system output signal.

FIG. 5D illustrates another example of a processing component suitable for use with the LIDAR systems.

FIG. 5E provides a schematic of electronics that are suitable for use with a processing component constructed according to FIG. 5D.

FIG. 8C is a topview of the system.

FIG. 8D is a cross section of the system shown in FIG. 8C taken through a waveguide on the LIDAR chip and the amplifier waveguide on the amplifier chip.

DESCRIPTION

A LIDAR system is configured to output a system output signal that travels away from the LIDAR system and can be reflected by an object located outside of the LIDAR system. The LIDAR system uses the reflected light to quantify the LIDAR data (the radial velocity and/or distance between the object and the LIDAR system) for the object.

In some instances, the LIDAR system includes an amplifier that receives a pre-amplifier signal and outputs an amplified light signal. The LIDAR system also includes electronics that operate the amplifier in the saturated state. Changes in the amplitude of a light signal do not pass through an amplifier operating in the saturated state. In contrast, changes in the frequency of a light signal do pass through an amplifier operating in the saturated state. As a result, the frequency of the pre-amplifier signal can be tuned and will be evident in the amplified light signal but the changes in amplitude that occur in the pre-amplifier signal will not be present in the amplified light signal. The system output signal includes light from the amplified light signal and can consist of light from the amplified light signal. As a result, the LIDAR system is configured to tune the frequency of the system output signal without changing or without substantially changing the amplitude of the system output signal. The constant amplitude of the system output signal increases the reliability of the LIDAR data.

Figure 1A:
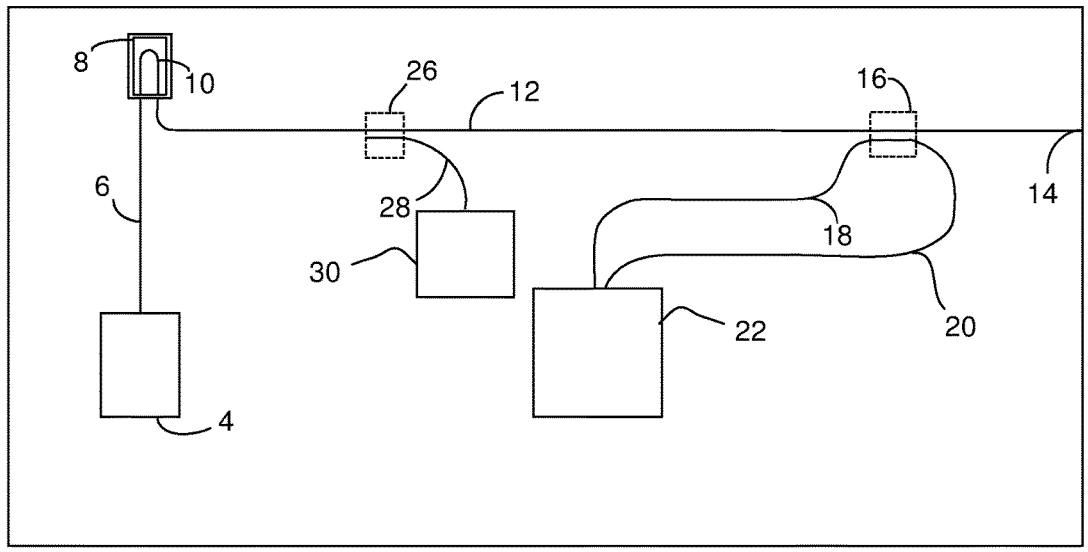
FIG. 1A is a topview of a schematic of a LIDAR system that includes or consists of a LIDAR chip that outputs a LIDAR output signal and receives a LIDAR input signal on a common waveguide.

FIG. 1A is a topview of a schematic of a LIDAR chip that can serve as a LIDAR system or can be included in a LIDAR system that includes components in addition to the LIDAR chip. The LIDAR chip can include a Photonic Integrated Circuit (PIC) and can be a Photonic Integrated Circuit chip. The LIDAR chip includes a light source 4 that outputs a preliminary outgoing LIDAR signal. A suitable light source 4 includes, but is not limited to, semiconductor lasers such as External Cavity Lasers (ECLs), Distributed Feedback lasers (DFBs), Discrete Mode (DM) lasers and Distributed Bragg Reflector lasers (DBRs).

The LIDAR chip also includes a preliminary utility waveguide 6 that receives the preliminary outgoing LIDAR signal from a light source 4 and carries the preliminary outgoing LIDAR signal to an amplifier 8. The amplifier 8 includes an amplifier waveguide 10 that receives the preliminary outgoing LIDAR signal from the preliminary utility waveguide 6 guides light from the preliminary outgoing LIDAR signal. Electronics 32 can operate the amplifier 8 such that the amplifier 8 outputs an amplified preliminary outgoing LIDAR signal that is received by the utility waveguide 12. The amplified preliminary outgoing LIDAR signal received by the utility waveguide 12 can serve as an outgoing LIDAR signal.

The utility waveguide 12 terminates at a facet 14 and carries the outgoing LIDAR signal to the facet 14. The facet 14 can be positioned such that the outgoing LIDAR signal traveling through the facet 14 exits the LIDAR chip and serves as a LIDAR output signal. For instance, the facet 14 can be positioned at an edge of the chip so the outgoing LIDAR signal traveling through the facet 14 exits the chip and serves as the LIDAR output signal. In some instances, the portion of the LIDAR output signal that has exited from the LIDAR chip can also be considered a system output signal. As an example, when the exit of the LIDAR output signal from the LIDAR chip is also an exit of the LIDAR output signal from the LIDAR system, the LIDAR output signal can also be considered a system output signal.

The LIDAR output signal travels away from the LIDAR system through free space in the atmosphere in which the LIDAR system is positioned. The LIDAR output signal may be reflected by one or more objects in the path of the LIDAR output signal. When the LIDAR output signal is reflected, at least a portion of the reflected light travels back toward the LIDAR chip as a LIDAR input signal. In some instances, the LIDAR input signal can also be considered a system return signal. As an example, when the exit of the LIDAR output signal from the LIDAR chip is also an exit of the LIDAR output signal from the LIDAR system, the LIDAR input signal can also be considered a system return signal.

The LIDAR input signals can enter the utility waveguide 12 through the facet 14. The portion of the LIDAR input signal that enters the utility waveguide 12 serves as an incoming LIDAR signal. The utility waveguide 12 carries the incoming LIDAR signal to a splitter 16 that moves a portion of the outgoing LIDAR signal from the utility waveguide 12 onto a comparative waveguide 18 as a comparative signal. The comparative waveguide 18 carries the comparative signal to a processing component 22 for further processing. Although FIG. 1A illustrates a directional coupler operating as the splitter 16, other signal tapping components can be used as the splitter 16. Suitable splitters 16 include, but are not limited to, directional couplers, optical couplers, y-junctions, tapered couplers, and Multi-Mode Interference (MIMI) devices.

The utility waveguide 12 also carrier the outgoing LIDAR signal to the splitter 16. The splitter 16 moves a portion of the outgoing LIDAR signal from the utility waveguide 12 onto a reference waveguide 20 as a reference signal. The reference waveguide 20 carries the reference signal to the processing component 22 for further processing.

The percentage of light transferred from the utility waveguide 12 by the splitter 16 can be fixed or substantially fixed. For instance, the splitter 16 can be configured such that the power of the reference signal transferred to the reference waveguide 20 is an outgoing percentage of the power of the outgoing LIDAR signal or such that the power of the comparative signal transferred to the comparative waveguide 18 is an incoming percentage of the power of the incoming LIDAR signal. In many splitters 16, such as directional couplers and multimode interferometers (MMIs), the outgoing percentage is equal or substantially equal to the incoming percentage. In some instances, the outgoing percentage is greater than 30%, 40%, or 49% and/or less than 51%, 60%, or 70% and/or the incoming percentage is greater than 30%, 40%, or 49% and/or less than 51%, 60%, or 70%. A splitter 16 such as a multimode interferometers (MMIs) generally provides an outgoing percentage and an incoming percentage of 50% or about 50%. However, multimode interferometers (MMIs) can be easier to fabricate in platforms such as silicon-on-insulator platforms than some alternatives. In one example, the splitter 16 is a multimode interferometer (MMI) and the outgoing percentage and the incoming percentage are 50% or substantially 50%. As will be described in more detail below, the processing component 22 combines the comparative signal with the reference signal to form a composite signal that carries LIDAR data for a sample region on the field of view. Accordingly, the composite signal can be processed so as to extract LIDAR data (radial velocity and/or distance between a LIDAR system and an object external to the LIDAR system) for the sample region.

The LIDAR chip can include a control branch for controlling operation of the light source 4. The control branch includes a splitter 26 that moves a portion of the outgoing LIDAR signal from the utility waveguide 12 onto a control waveguide 28. The coupled portion of the outgoing LIDAR signal serves as a tapped signal. Although FIG. 1A illustrates a directional coupler operating as the splitter 26, other signal tapping components can be used as the splitter 26. Suitable splitters 26 include, but are not limited to, directional couplers, optical couplers, y-junctions, tapered couplers, and Multi-Mode Interference (MIMI) devices.

The control waveguide 28 carries the tapped signal to control components 30. The control components can be in electrical communication with electronics 32. During operation, the electronics 32 can adjust the frequency of the outgoing LIDAR signal in response to output from the control components. An example of a suitable construction of control components is provided in U.S. patent application Ser. No. 15/977,957, filed on 11 May 2018, entitled "Optical Sensor Chip," and incorporated herein in its entirety.

Figure 1B:
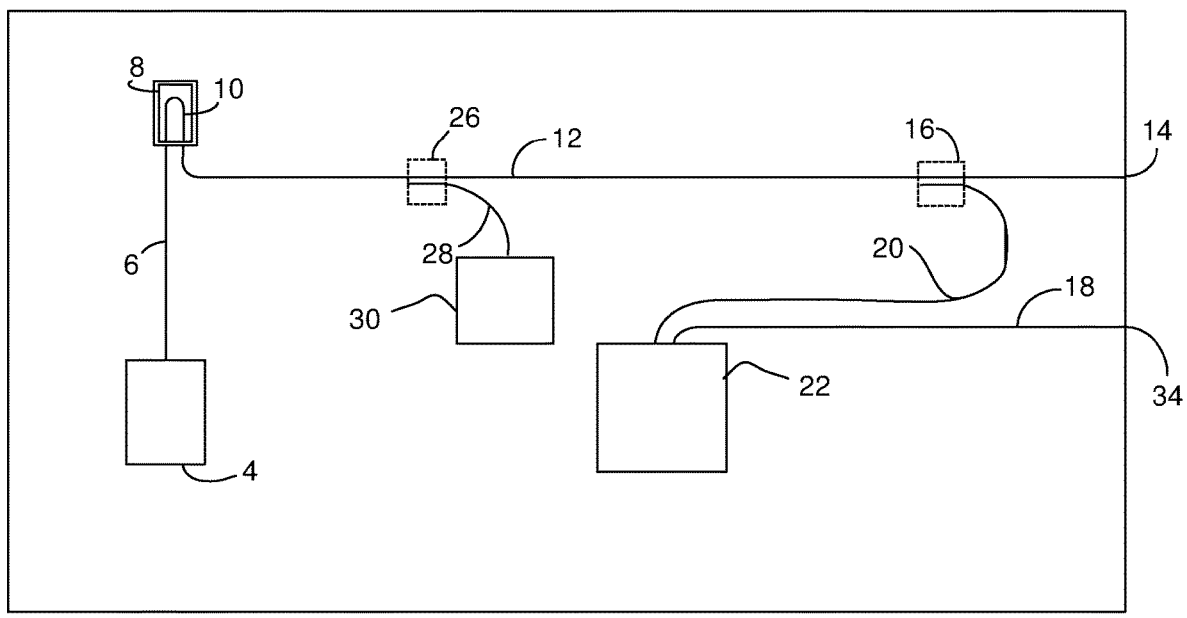
FIG. 1B is a topview of a schematic of a LIDAR system that includes or consists of a LIDAR chip that outputs a LIDAR output signal and receives a LIDAR input signal on different waveguides.

The LIDAR system can be modified so the incoming LIDAR signal and the outgoing LIDAR signal can be carried on different waveguides. For instance, FIG. 1B is a topview of the LIDAR chip of FIG. 1A modified such that the incoming LIDAR signal and the outgoing LIDAR signal are carried on different waveguides. The outgoing LIDAR signal exits the LIDAR chip through the facet 14 and serves as the LIDAR output signal. When light from the LIDAR output signal is reflected by an object external to the LIDAR system, at least a portion of the reflected light returns to the LIDAR chip as a first LIDAR input signal. The first LIDAR input signals enters the comparative waveguide 18 through a facet 34 and serves as the comparative signal. The comparative waveguide 18 carries the comparative signal to a processing component 22 for further processing. As described in the context of FIG. 1A, the reference waveguide 20 carries the reference signal to the processing component 22 for further processing. As will be described in more detail below, the processing component 22 combines the comparative signal with the reference signal to form a composite signal that carries LIDAR data for a sample region on the field of view.

Figure 1C:
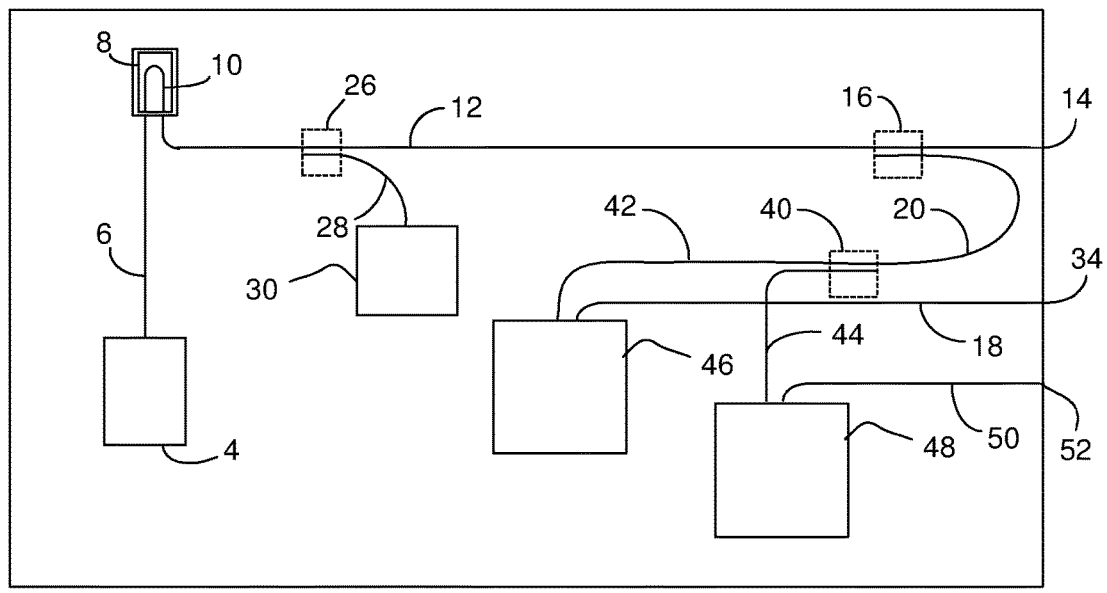
FIG. 1C is a topview of a schematic of another embodiment of a LIDAR system that that includes or consists of a LIDAR chip that outputs a LIDAR output signal and receives multiple LIDAR input signals on different waveguides.

The LIDAR chips can be modified to receive multiple LIDAR input signals. For instance, FIG. 1C illustrates the LIDAR chip of FIG. 1B modified to receive two LIDAR input signals. A splitter 40 is configured to place a portion of the reference signal carried on the reference waveguide 20 on a first reference waveguide 42 and another portion of the reference signal on a second reference waveguide 44. Accordingly, the first reference waveguide 42 carries a first reference signal and the second reference waveguide 44 carries a second reference signal. The first reference waveguide 42 carries the first reference signal to a first processing component 46 and the second reference waveguide 44 carries the second reference signal to a second processing component 48. Examples of suitable splitters 40 include, but are not limited to, y-junctions, optical couplers, and multimode interference couplers (MMIs).

The outgoing LIDAR signal exits the LIDAR chip through the facet 14 and serves as the LIDAR output signal. When light from the LIDAR output signal is reflected by one or more object located external to the LIDAR system, at least a portion of the reflected light returns to the LIDAR chip as a first LIDAR input signal. The first LIDAR input signals enters the comparative waveguide 18 through the facet 34 and serves as a first comparative signal. The comparative waveguide 18 carries the first comparative signal to a first processing component 46 for further processing.

Additionally, when light from the LIDAR output signal is reflected by one or more object located external to the LIDAR system, at least a portion of the reflected signal returns to the LIDAR chip as a second LIDAR input signal. The second LIDAR input signals enters a second comparative waveguide 50 through a facet 52 and serves as a second comparative signal carried by the second comparative waveguide 50. The second comparative waveguide 50 carries the second comparative signal to a second processing component 48 for further processing.

Figure 1D:
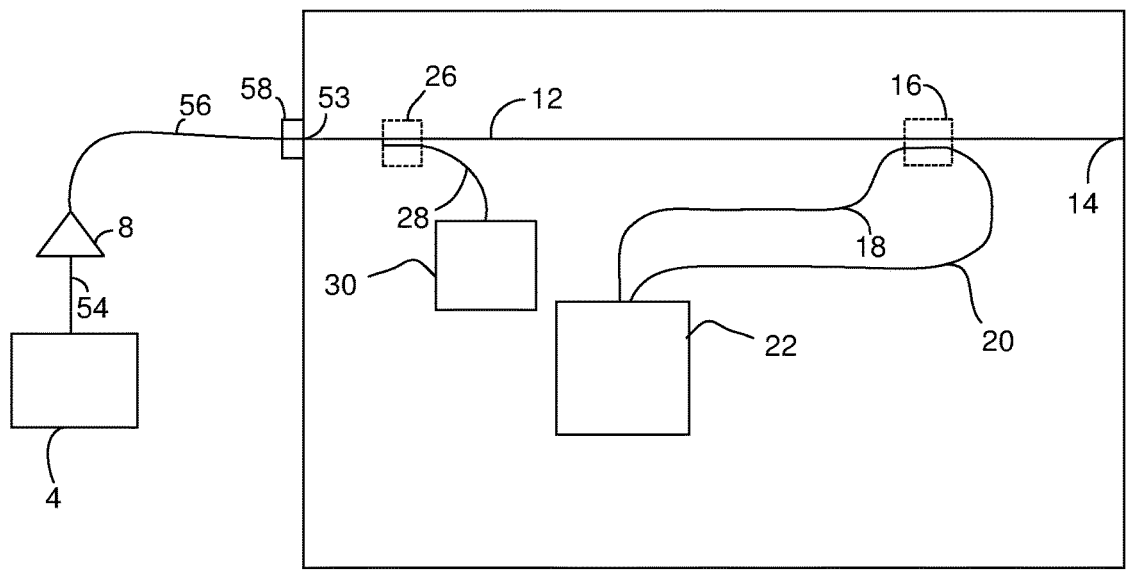
FIG. 1D is a topview of a schematic of a LIDAR system that that includes a LIDAR chip that receives an outgoing LIDAR signal from a light source located off the LIDAR chip.

Although the light source 4 and amplifier 8 are shown as being positioned on the LIDAR chip, the light source 4 and amplifier 8 can be located off the LIDAR chip. For instance, the utility waveguide 12 can terminate at a second facet through which the outgoing LIDAR signal can enter the utility waveguide 12 from a light source 4 located off the LIDAR chip. As an example, FIG. 1D illustrates the LIDAR system of FIG. 1A modified to include a light source 4 and amplifier 8 located off of the LIDAR chip. The utility waveguide 12 includes a second facet 53 through which the outgoing LIDAR signal can enter the utility waveguide 12.

A first optical link 54 receives the preliminary outgoing LIDAR signal from the light source 4. The first optical link 54 carries the preliminary outgoing LIDAR signal to the amplifier 8. The electronics 32 operate the amplifier 8 such that the amplifier 8 outputs an amplified preliminary outgoing LIDAR signal that is received on a second optical link 56. The second optical link 56 is aligned with the utility waveguide 12 such that the amplified preliminary outgoing LIDAR signal can enter the utility waveguide 12 through the second facet 53. An alignment mechanism 58 such as a fiber block can provide alignment between the second optical link 56 and the utility waveguide 12. When the light source 4 is external to the LIDAR chip, suitable light sources include, but are not limited to, semiconductor lasers such as External Cavity Lasers (ECLs), Distributed Feedback lasers (DFBs), Discrete Mode (DM) lasers and Distributed Bragg Reflector lasers (DBRs). In some instances, the LIDAR system includes one or more lenses (not shown) that couple the preliminary outgoing LIDAR source into the amplifier 57 or the second preliminary outgoing LIDAR source into the utility waveguide 12. Suitable optical components for the first optical link 54 and/or the second optical link 56 include, but are not limited to, optical fibers. Suitable amplifiers 8 for use with the optical fibers that serve as the first optical link 54 and/or the second optical link 56 include, but are not limited to, semiconductor optical amplifiers (SOAs), booster optical amplifiers (BOAs), and Erbium Ytterbium doped amplifiers.

Figure 1E:
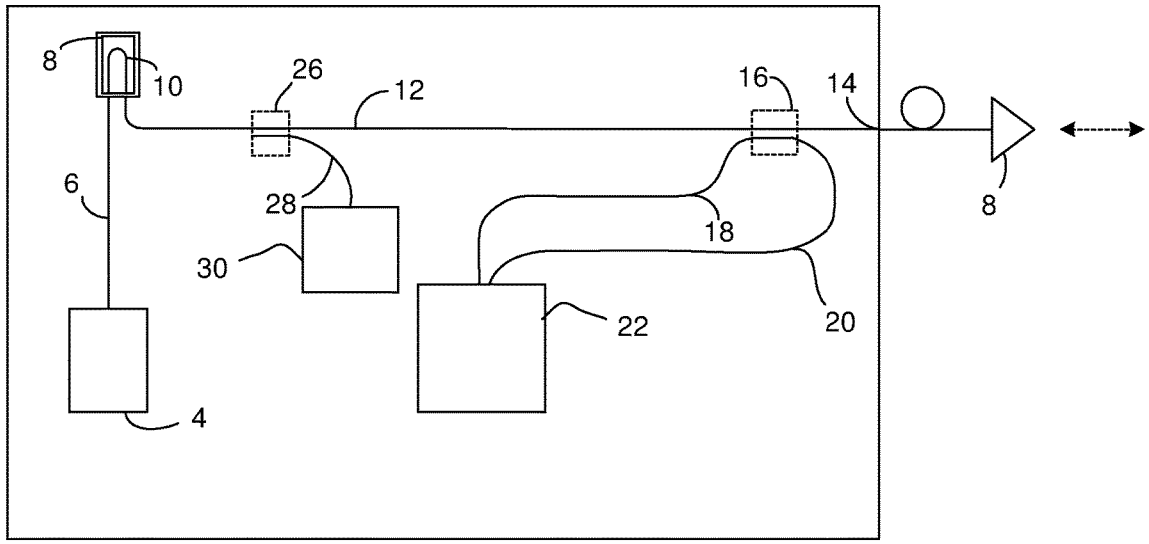
FIG. 1E is a topview of the LIDAR system of FIG. 1A modified to include an amplifier that receives the LIDAR output signal from the LIDAR chip.
Figure 1E:

FIG. 1A through FIG. 1D illustrate the amplifier 8 positioned on the optical pathway from the light source 4 and the splitter 16; however, the amplifier 8 can be positioned in other locations. As an example, FIG. 1E illustrates the amplifier positioned to receive the LIDAR output signal output from the LIDAR chip. In the LIDAR system of FIG. 1E, an optical link 60 receives the LIDAR output signal from the LIDAR chip. The optical link 60 carries the LIDAR output signal to the amplifier 8. The electronics 32 operate the amplifier 8 such that the amplifier 8 outputs an amplified LIDAR output signal. The LIDAR system can be configured such that the output of the amplified LIDAR output signal from the amplifier 8 can also serve as the output of the amplified LIDAR output signal from the LIDAR system. As a result, the amplified LIDAR signal can travel through free space toward a sample region in the field of view. Accordingly, in some instances, the amplified LIDAR output signal that has exited from the LIDAR adapter can serve as the system output signal. Alternately, the LIDAR system can include one or more additional components (not illustrated) that receive the amplified LIDAR output signal and output the system output signal Suitable optical components for the optical link 60 include, but are not limited to, optical fibers. Suitable amplifiers 8 for use with the optical fibers that serve as the optical link 60 include, but are not limited to, semiconductor optical amplifiers (SOAs), booster optical amplifiers (BOAs), and Erbium Ytterbium doped amplifiers. An alignment mechanism 58 such as a fiber block can provide alignment between the optical link 60 and the utility waveguide 12.

Figure 1F:
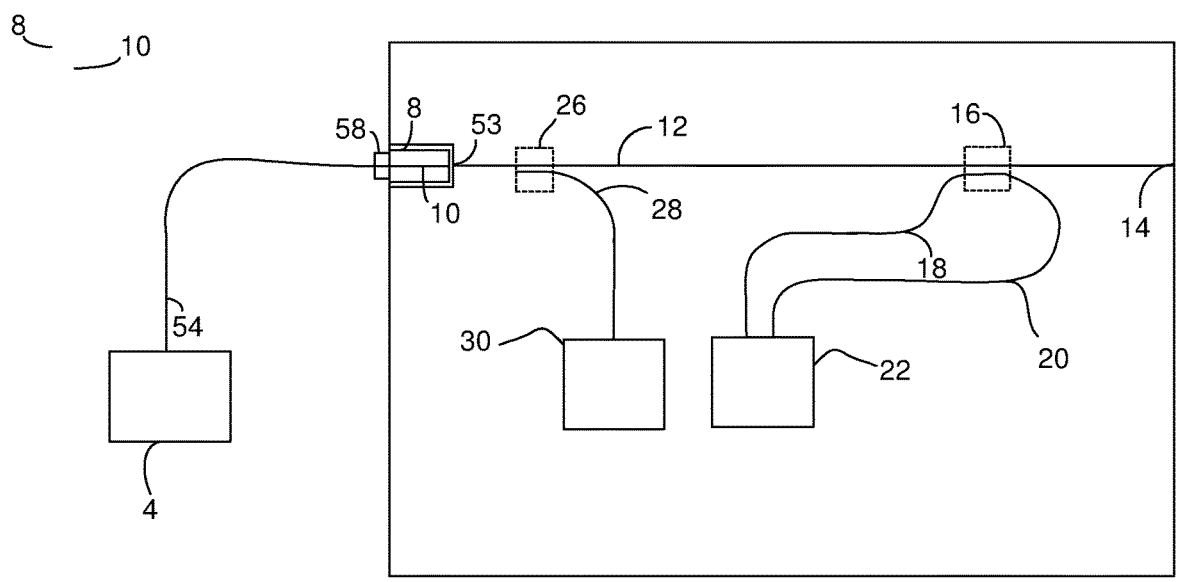
FIG. 1F is a topview of the LIDAR system of FIG. 1D modified to include an amplifier positioned at an edge of the LIDAR chip.
Figure 1F:
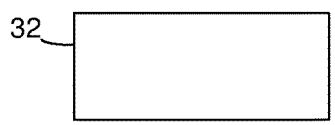

The LIDAR systems illustrated in Fire 1D and FIG. 1E can be modified so the amplifier 8 is positioned an edge of the LIDAR chip. For instance, FIG. 1F illustrates the LIDAR system of Fire 1D modified to have the amplifier positioned on the LIDAR chip but at an edge of the LIDAR chip. In some instances where the LIDAR chip is positioned at an edge of the LIDAR chip, the LIDAR chip does not surround the lateral sides of the amplifier and/or a lateral side of the LIDAR chip is not covered by the LIDAR chip.

In the LIDAR system of FIG. 1F, the first optical link 54 receives the preliminary outgoing LIDAR signal from the light source 4. The first optical link 54 carries the preliminary outgoing LIDAR signal to the amplifier 8 on the LIDAR chip. The amplifier waveguide 10 receives the preliminary outgoing LIDAR signal from the first optical link 54 and guides light from the preliminary outgoing LIDAR signal. The electronics 32 operate the amplifier 8 such that the amplifier 8 outputs an amplified preliminary outgoing LIDAR signal that is received by the utility waveguide 12 through the second facet 53. The amplified preliminary outgoing LIDAR signal received by the utility waveguide 12 can serve as the outgoing LIDAR signal guided by the utility waveguide 12. An alignment mechanism 58 such as a fiber block can provide alignment between the optical link 60 and the amplifier waveguide 10.

In some instances, a LIDAR chip constructed according to FIG. 1B or FIG. 1C is used in conjunction with a LIDAR adapter. In some instances, the LIDAR adapter can be physically optically positioned between the LIDAR chip and the one or more reflecting objects and/or the field of view in that an optical path that the first LIDAR input signal(s) and/or the LIDAR output signal travels from the LIDAR chip to the field of view passes through the LIDAR adapter. Additionally, the LIDAR adapter can be configured to operate on the first LIDAR input signal and the LIDAR output signal such that the first LIDAR input signal and the LIDAR output signal travel on different optical pathways between the LIDAR adapter and the LIDAR chip but on the same optical pathway between the LIDAR adapter and a reflecting object in the field of view.

Figure 2:
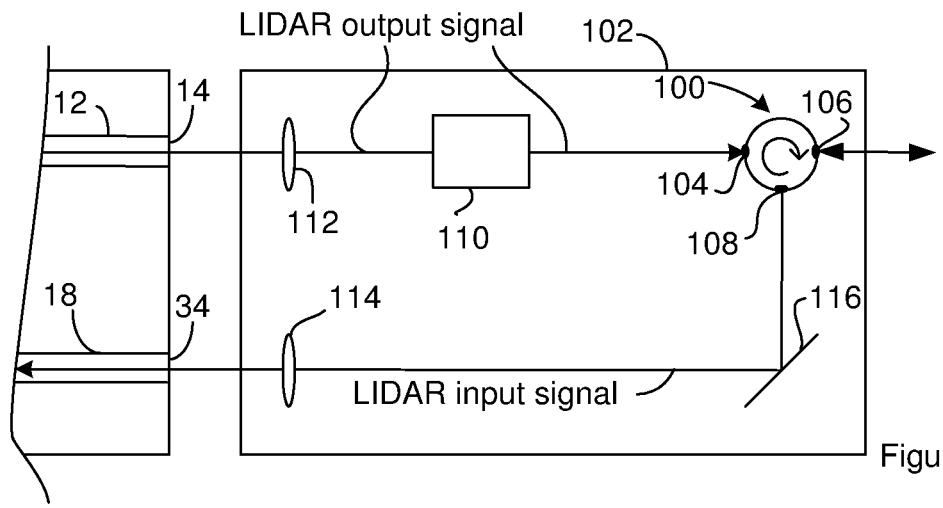
FIG. 2 is a topview of an example of a LIDAR adapter that is suitable for use with the LIDAR chip of FIG. 1B.

An example of a LIDAR adapter that is suitable for use with the LIDAR chip of FIG. 1B is illustrated in FIG. 2. The LIDAR adapter includes multiple components positioned on a base. For instance, the LIDAR adapter includes a circulator 100 positioned on a base 102. The illustrated optical circulator 100 includes three ports and is configured such that light entering one port exits from the next port. For instance, the illustrated optical circulator includes a first port 104, a second port 106, and a third port 108. The LIDAR output signal enters the first port 104 from the utility waveguide 12 of the LIDAR chip and exits from the second port 106.

The LIDAR adapter can be configured such that the output of the LIDAR output signal from the second port 106 can also serve as the output of the LIDAR output signal from the LIDAR adapter and accordingly from the LIDAR system. As a result, the LIDAR output signal can be output from the LIDAR adapter such that the LIDAR output signal is traveling toward a sample region in the field of view. Accordingly, in some instances, the portion of the LIDAR output signal that has exited from the LIDAR adapter can also be considered the system output signal. As an example, when the exit of the LIDAR output signal from the LIDAR adapter is also an exit of the LIDAR output signal from the LIDAR system, the LIDAR output signal can also be considered a system output signal.

The LIDAR output signal output from the LIDAR adapter includes, consists of, or consists essentially of light from the LIDAR output signal received from the LIDAR chip. Accordingly, the LIDAR output signal output from the LIDAR adapter may be the same or substantially the same as the LIDAR output signal received from the LIDAR chip. However, there may be differences between the LIDAR output signal output from the LIDAR adapter and the LIDAR output signal received from the LIDAR chip. For instance, the LIDAR output signal can experience optical loss as it travels through the LIDAR adapter and/or the LIDAR adapter can optionally include an amplifier configured to amplify the LIDAR output signal as it travels through the LIDAR adapter.

When one or more objects in the sample region reflect the LIDAR output signal, at least a portion of the reflected light travels back to the circulator 100 as a system return signal. The system return signal enters the circulator 100 through the second port 106. FIG. 2 illustrates the LIDAR output signal and the system return signal traveling between the LIDAR adapter and the sample region along the same optical path.

The system return signal exits the circulator 100 through the third port 108 and is directed to the comparative waveguide 18 on the LIDAR chip. Accordingly, all or a portion of the system return signal can serve as the first LIDAR input signal and the first LIDAR input signal includes or consists of light from the system return signal. Accordingly, the LIDAR output signal and the first LIDAR input signal travel between the LIDAR adapter and the LIDAR chip along different optical paths.

As is evident from FIG. 2, the LIDAR adapter can include optical components in addition to the circulator 100. For instance, the LIDAR adapter can include components for directing and controlling the optical path of the LIDAR output signal and the system return signal. As an example, the adapter of FIG. 2 includes an optional amplifier 110 positioned so as to receive and amplify the LIDAR output signal before the LIDAR output signal enters the circulator 100. The amplifier 110 can be operated by the electronics 32 allowing the electronics 32 to control the power of the LIDAR output signal.

FIG. 2 also illustrates the LIDAR adapter including an optional first lens 112 and an optional second lens 114. The first lens 112 can be configured to couple the LIDAR output signal to a desired location. In some instances, the first lens 112 is configured to focus or collimate the LIDAR output signal at a desired location. In one example, the first lens 112 is configured to couple the LIDAR output signal on the first port 104 when the LIDAR adapter does not include an amplifier 110. As another example, when the LIDAR adapter includes an amplifier 110, the first lens 112 can be configured to couple the LIDAR output signal on the entry port to the amplifier 110. The second lens 114 can be configured to couple the LIDAR output signal at a desired location. In some instances, the second lens 114 is configured to focus or collimate the LIDAR output signal at a desired location. For instance, the second lens 114 can be configured to couple the LIDAR output signal the on the facet 34 of the comparative waveguide 18.

The LIDAR adapter can also include one or more direction changing components such as mirrors. FIG. 2 illustrates the LIDAR adapter including a mirror as a direction-changing component 116 that redirects the system return signal from the circulator 100 to the facet 20 of the comparative waveguide 18.

The LIDAR chips include one or more waveguides that constrains the optical path of one or more light signals. While the LIDAR adapter can include waveguides, the optical path that the system return signal and the LIDAR output signal travel between components on the LIDAR adapter and/or between the LIDAR chip and a component on the LIDAR adapter can be free space. For instance, the system return signal and/or the LIDAR output signal can travel through the atmosphere in which the LIDAR chip, the LIDAR adapter, and/or the base 102 is positioned when traveling between the different components on the LIDAR adapter and/or between a component on the LIDAR adapter and the LIDAR chip. As a result, optical components such as lenses and direction changing components can be employed to control the characteristics of the optical path traveled by the system return signal and the LIDAR output signal on, to, and from the LIDAR adapter.

Suitable bases 102 for the LIDAR adapter include, but are not limited to, substrates, platforms, and plates. Suitable substrates include, but are not limited to, glass, silicon, and ceramics. The components can be discrete components that are attached to the substrate. Suitable techniques for attaching discrete components to the base 102 include, but are not limited to, epoxy, solder, and mechanical clamping. In one example, one or more of the components are integrated components and the remaining components are discrete components. In another example, the LIDAR adapter includes one or more integrated amplifiers and the remaining components are discrete components.

The LIDAR system can be configured to compensate for polarization. Light from a laser source is typically linearly polarized and hence the LIDAR output signal is also typically linearly polarized. Reflection from an object may change the angle of polarization of the returned light. Accordingly, the system return signal can include light of different linear polarization states. For instance, a first portion of a system return signal can include light of a first linear polarization state and a second portion of a system return signal can include light of a second linear polarization state. The intensity of the resulting composite signals is proportional to the square of the cosine of the angle between the comparative and reference signal polarization fields. If the angle is 90 degrees, the LIDAR data can be lost in the resulting composite signal. However, the LIDAR system can be modified to compensate for changes in polarization state of the LIDAR output signal.

Figure 3:
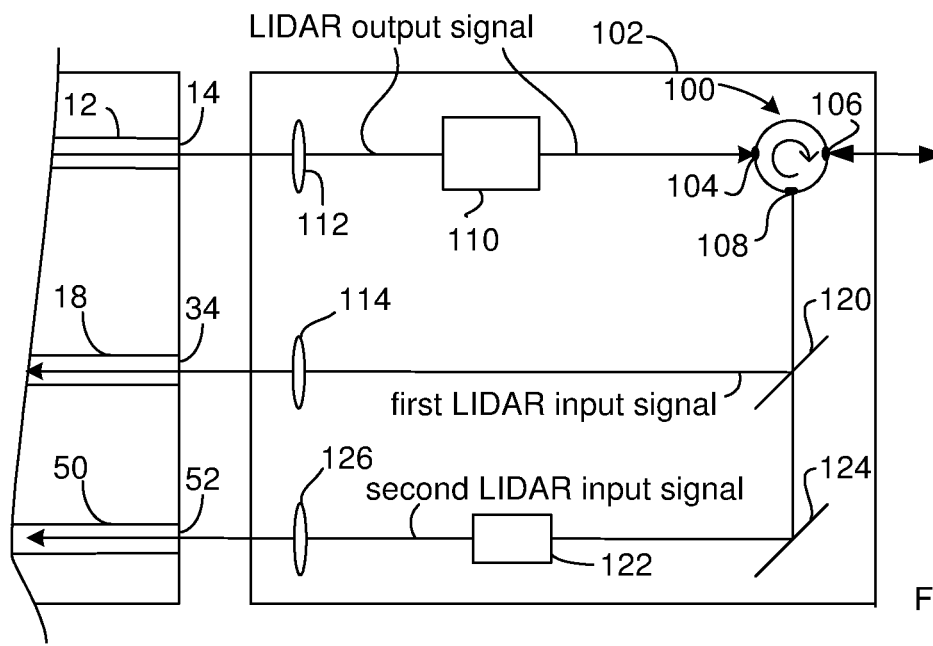
FIG. 3 is a topview of an example of a LIDAR adapter that is suitable for use with the LIDAR chip of FIG. 1C.

FIG. 3 illustrates the LIDAR system of FIG. 3 modified such that the LIDAR adapter is suitable for use with the LIDAR chip of FIG. 1C. The LIDAR adapter includes a beamsplitter 120 that receives the system return signal from the circulator 100. The beamsplitter 120 splits the system return signal into a first portion of the system return signal and a second portion of the system return signal. Suitable beamsplitters include, but are not limited to, Wollaston prisms, and MEMS-based beamsplitters.

The first portion of the system return signal is directed to the comparative waveguide 18 on the LIDAR chip and serves as the first LIDAR input signal described in the context of FIG. 1C. The second portion of the system return signal is directed a polarization rotator 122. The polarization rotator 122 outputs a second LIDAR input signal that is directed to the second input waveguide 76 on the LIDAR chip and serves as the second LIDAR input signal.

The beamsplitter 120 can be a polarizing beam splitter. One example of a polarizing beamsplitter is constructed such that the first portion of the system return signal has a first polarization state but does not have or does not substantially have a second polarization state and the second portion of the system return signal has a second polarization state but does not have or does not substantially have the first polarization state. The first polarization state and the second polarization state can be linear polarization states and the second polarization state is different from the first polarization state. For instance, the first polarization state can be TE and the second polarization state can be TM or the first polarization state can be TM and the second polarization state can be TE. In some instances, the laser source can linearly polarized such that the LIDAR output signal has the first polarization state. Suitable beamsplitters include, but are not limited to, Wollaston prisms, and MEMs-based polarizing beamsplitters.

A polarization rotator can be configured to change the polarization state of the first portion of the system return signal and/or the second portion of the system return signal. For instance, the polarization rotator 122 shown in FIG. 3 can be configured to change the polarization state of the second portion of the system return signal from the second polarization state to the first polarization state. As a result, the second LIDAR input signal has the first polarization state but does not have or does not substantially have the second polarization state. Accordingly, the first LIDAR input signal and the second LIDAR input signal each have the same polarization state (the first polarization state in this example). Despite carrying light of the same polarization state, the first LIDAR input signal and the second LIDAR input signal are associated with different polarization states as a result of the use of the polarizing beamsplitter. For instance, the first LIDAR input signal carries the light reflected with the first polarization state and the second LIDAR input signal carries the light reflected with the second polarization state. As a result, the first LIDAR input signal is associated with the first polarization state and the second LIDAR input signal is associated with the second polarization state.

Since the first LIDAR input signal and the second LIDAR carry light of the same polarization state, the comparative signals that result from the first LIDAR input signal have the same polarization angle as the comparative signals that result from the second LIDAR input signal.

Suitable polarization rotators include, but are not limited to, rotation of polarization-maintaining fibers, Faraday rotators, half-wave plates, MEMs-based polarization rotators and integrated optical polarization rotators using asymmetric y-branches, Mach-Zehnder interferometers and multimode interference couplers.

Since the outgoing LIDAR signal is linearly polarized, the first reference signals can have the same linear polarization state as the second reference signals. Additionally, the components on the LIDAR adapter can be selected such that the first reference signals, the second reference signals, the comparative signals and the second comparative signals each have the same polarization state. In the example disclosed in the context of FIG. 3, the first comparative signals, the second comparative signals, the first reference signals, and the second reference signals can each have light of the first polarization state.

As a result of the above configuration, first composite signals generated by the first processing component 46 and second composite signals generated by the second processing component 48 each results from combining a reference signal and a comparative signal of the same polarization state and will accordingly provide the desired beating between the reference signal and the comparative signal. For instance, the composite signal results from combining a first reference signal and a first comparative signal of the first polarization state and excludes or substantially excludes light of the second polarization state or the composite signal results from combining a first reference signal and a first comparative signal of the second polarization state and excludes or substantially excludes light of the first polarization state. Similarly, the second composite signal includes a second reference signal and a second comparative signal of the same polarization state will accordingly provide the desired beating between the reference signal and the comparative signal. For instance, the second composite signal results from combining a second reference signal and a second comparative signal of the first polarization state and excludes or substantially excludes light of the second polarization state or the second composite signal results from combining a second reference signal and a second comparative signal of the second polarization state and excludes or substantially excludes light of the first polarization state.

The above configuration results in the LIDAR data for a single sample region in the field of view being generated from multiple different composite signals (i.e. first composite signals and the second composite signal) from the sample region. In some instances, determining the LIDAR data for the sample region includes the electronics combining the LIDAR data from different composite signals (i.e. the composite signals and the second composite signal). Combining the LIDAR data can include taking an average, median, or mode of the LIDAR data generated from the different composite signals. For instance, the electronics can average the distance between the LIDAR system and the reflecting object determined from the composite signal with the distance determined from the second composite signal and/or the electronics can average the radial velocity between the LIDAR system and the reflecting object determined from the composite signal with the radial velocity determined from the second composite signal.

In some instances, determining the LIDAR data for a sample region includes the electronics identifying one or more composite signals (i.e. the composite signal and/or the second composite signal) as the source of the LIDAR data that is most represents reality (the representative LIDAR data). The electronics can then use the LIDAR data from the identified composite signal as the representative LIDAR data to be used for additional processing. For instance, the electronics can identify the signal (composite signal or the second composite signal) with the larger amplitude as having the representative LIDAR data and can use the LIDAR data from the identified signal for further processing by the LIDAR system. In some instances, the electronics combine identifying the composite signal with the representative LIDAR data with combining LIDAR data from different LIDAR signals. For instance, the electronics can identify each of the composite signals with an amplitude above an amplitude threshold as having representative LIDAR data and when more than two composite signals are identified as having representative LIDAR data, the electronics can combine the LIDAR data from each of identified composite signals. When one composite signal is identified as having representative LIDAR data, the electronics can use the LIDAR data from that composite signal as the representative LIDAR data. When none of the composite signals is identified as having representative LIDAR data, the electronics can discard the LIDAR data for the sample region associated with those composite signals.

Although FIG. 3 is described in the context of components being arranged such that the first comparative signals, the second comparative signals, the first reference signals, and the second reference signals each have the first polarization state, other configurations of the components in FIG. 3 can arranged such that the composite signals result from combining a reference signal and a comparative signal of the same linear polarization state and the second composite signal results from combining a reference signal and a comparative signal of the same linear polarization state. For instance, the beamsplitter 120 can be constructed such that the second portion of the system return signal has the first polarization state and the first portion of the system return signal has the second polarization state, the polarization rotator receives the first portion of the system return signal, and the outgoing LIDAR signal can have the second polarization state. In this example, the first LIDAR input signal and the second LIDAR input signal each has the second polarization state.

The above system configurations result in the first portion of the system return signal and the second portion of the system return signal being directed into different composite signals. As a result, since the first portion of the system return signal and the second portion of the system return signal are each associated with a different polarization state but electronics can process each of the composite signals, the LIDAR system compensates for changes in the polarization state of the LIDAR output signal in response to reflection of the LIDAR output signal.

The LIDAR adapter of FIG. 3 can include additional optical components including passive optical components. For instance, the LIDAR adapter can include an optional third lens 126. The third lens 126 can be configured to couple the second LIDAR output signal at a desired location. In some instances, the third lens 126 focuses or collimates the second LIDAR output signal at a desired location. For instance, the third lens 126 can be configured to focus or collimate the second LIDAR output signal on the facet 52 of the second comparative waveguide 50. The LIDAR adapter also includes one or more direction changing components 124 such as mirrors and prisms. FIG. 3 illustrates the LIDAR adapter including a mirror as a direction changing component 124 that redirects the second portion of the system return signal from the circulator 100 to the facet 52 of the second comparative waveguide 50 and/or to the third lens 126.

Figure 4:
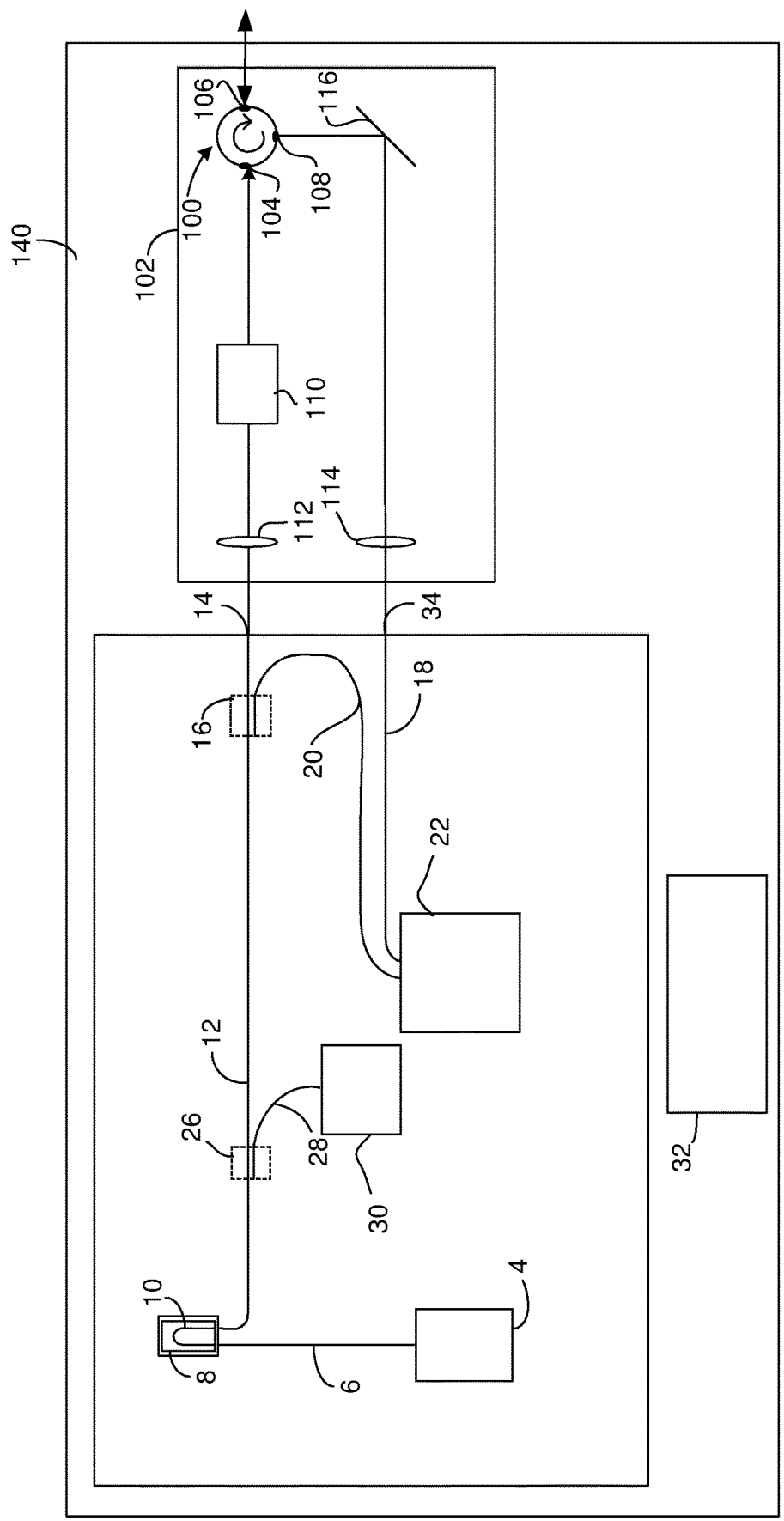
FIG. 4 is a topview of an example of a LIDAR system that includes the LIDAR chip of FIG. 1A and the LIDAR adapter of FIG. 2 on a common support.

When the LIDAR system includes a LIDAR chip and a LIDAR adapter, the LIDAR chip, electronics, and the LIDAR adapter can be positioned on a common mount. Suitable common mounts include, but are not limited to, glass plates, metal plates, silicon plates and ceramic plates. As an example, FIG. 4 is a topview of a LIDAR system that includes the LIDAR chip and electronics 32 of FIG. 1A and the LIDAR adapter of FIG. 2 on a common support 140. Although the electronics 32 are illustrated as being located on the common support, all or a portion of the electronics can be located off the common support. When the light source 4 is located off the LIDAR chip, the light source can be located on the common support 140 or off of the common support 140. Suitable approaches for mounting the LIDAR chip, electronics, and/or the LIDAR adapter on the common support include, but are not limited to, epoxy, solder, and mechanical clamping.

The LIDAR systems can include components including additional passive and/or active optical components. For instance, the LIDAR system can include one or more components that receive the LIDAR output signal from the LIDAR chip or from the LIDAR adapter. The portion of the LIDAR output signal that exits from the one or more components can serve as the system output signal. As an example, the LIDAR system can include one or more beam steering components that receive the LIDAR output signal from the LIDAR chip or from the LIDAR adapter and that output all or a fraction of the LIDAR output signal that serves as the system output signal. Suitable beam steering components include, but are not limited to, movable mirrors, MEMS mirrors, and optical phased arrays (OPAs).

Figure 5A:
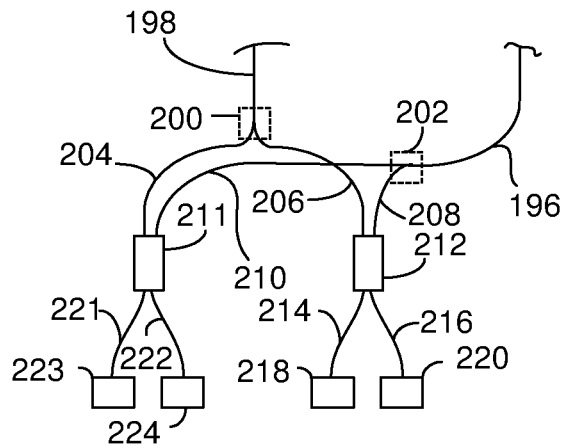
FIG. 5A illustrates an example of a processing component suitable for use with the LIDAR systems.
Figure 5B:
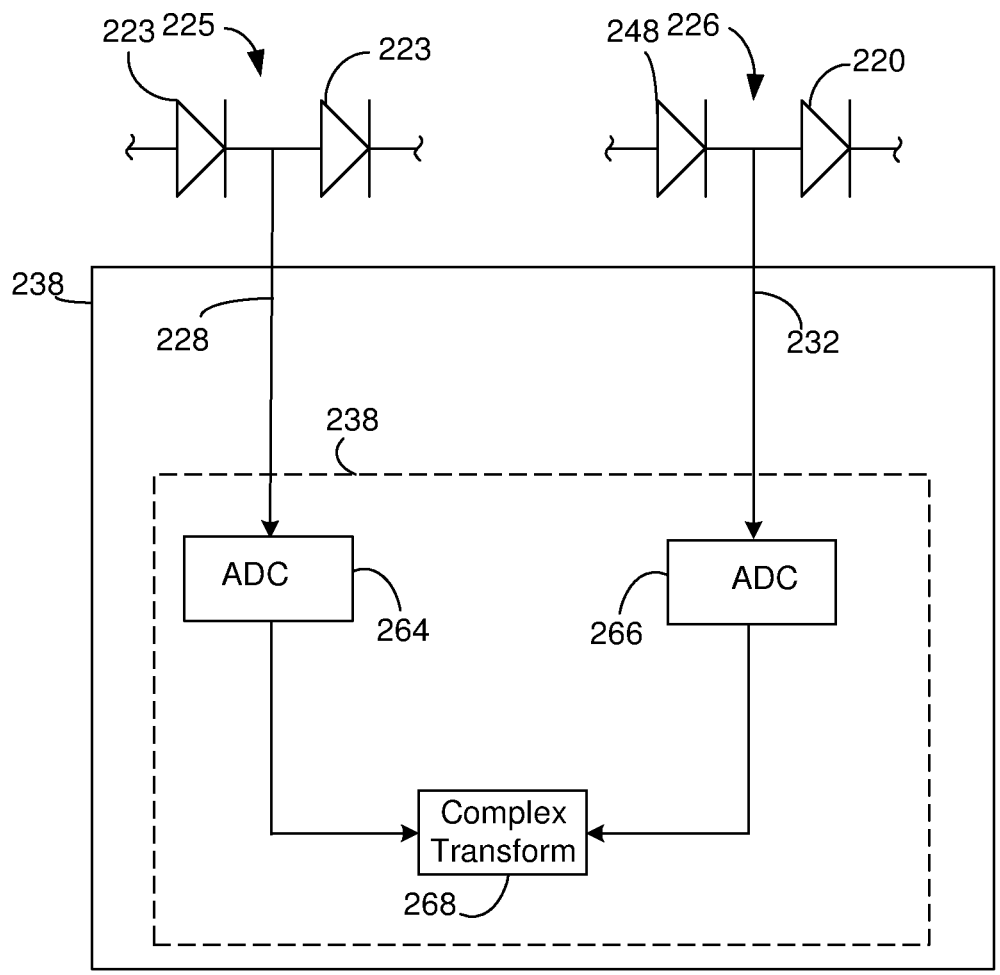
FIG. 5B provides a schematic of electronics that are suitable for use with a processing component constructed according to FIG. 5A.

FIG. 5A through FIG. 5C illustrate an example of a suitable processing component for use as all or a fraction of the processing components selected from the group consisting of the processing component 22, the first processing component 46 and the second processing component 48. The processing component receives a comparative signal from a comparative waveguide 196 and a reference signal from a reference waveguide 198. The comparative waveguide 18 and the reference waveguide 20 shown in FIG. 1A and FIG. 1B can serve as the comparative waveguide 196 and the reference waveguide 198, the comparative waveguide 18 and the first reference waveguide 42 shown in FIG. 1C can serve as the comparative waveguide 196 and the reference waveguide 198, or the second comparative waveguide 50 and the second reference waveguide 44 shown in FIG. 1C can serve as the comparative waveguide 196 and the reference waveguide 198.

The processing component includes a second splitter 200 that divides the comparative signal carried on the comparative waveguide 196 onto a first comparative waveguide 204 and a second comparative waveguide 206. The first comparative waveguide 204 carries a first portion of the comparative signal to the light-combining component 211. The second comparative waveguide 208 carries a second portion of the comparative signal to the second light-combining component 212.

The processing component includes a first splitter 202 that divides the reference signal carried on the reference waveguide 198 onto a first reference waveguide 204 and a second reference waveguide 206. The first reference waveguide 204 carries a first portion of the reference signal to the light-combining component 211. The second reference waveguide 208 carries a second portion of the reference signal to the second light-combining component 212.

The second light-combining component 212 combines the second portion of the comparative signal and the second portion of the reference signal into a second composite signal. Due to the difference in frequencies between the second portion of the comparative signal and the second portion of the reference signal, the second composite signal is beating between the second portion of the comparative signal and the second portion of the reference signal.

The second light-combining component 212 also splits the resulting second composite signal onto a first auxiliary detector waveguide 214 and a second auxiliary detector waveguide 216. The first auxiliary detector waveguide 214 carries a first portion of the second composite signal to a first auxiliary light sensor 218 that converts the first portion of the second composite signal to a first auxiliary electrical signal. The second auxiliary detector waveguide 216 carries a second portion of the second composite signal to a second auxiliary light sensor 220 that converts the second portion of the second composite signal to a second auxiliary electrical signal. Examples of suitable light sensors include germanium photodiodes (PDs), and avalanche photodiodes (APDs).

In some instances, the second light-combining component 212 splits the second composite signal such that the portion of the comparative signal (i.e. the portion of the second portion of the comparative signal) included in the first portion of the second composite signal is phase shifted by 180° relative to the portion of the comparative signal (i.e. the portion of the second portion of the comparative signal) in the second portion of the second composite signal but the portion of the reference signal (i.e. the portion of the second portion of the reference signal) in the second portion of the second composite signal is not phase shifted relative to the portion of the reference signal (i.e. the portion of the second portion of the reference signal) in the first portion of the second composite signal. Alternately, the second light-combining component 212 splits the second composite signal such that the portion of the reference signal (i.e. the portion of the second portion of the reference signal) in the first portion of the second composite signal is phase shifted by 180° relative to the portion of the reference signal (i.e. the portion of the second portion of the reference signal) in the second portion of the second composite signal but the portion of the comparative signal (i.e. the portion of the second portion of the comparative signal) in the first portion of the second composite signal is not phase shifted relative to the portion of the comparative signal (i.e. the portion of the second portion of the comparative signal) in the second portion of the second composite signal. Examples of suitable light sensors include germanium photodiodes (PDs), and avalanche photodiodes (APDs).

The first light-combining component 211 combines the first portion of the comparative signal and the first portion of the reference signal into a first composite signal. Due to the difference in frequencies between the first portion of the comparative signal and the first portion of the reference signal, the first composite signal is beating between the first portion of the comparative signal and the first portion of the reference signal.

The first light-combining component 211 also splits the first composite signal onto a first detector waveguide 221 and a second detector waveguide 222. The first detector waveguide 221 carries a first portion of the first composite signal to a first light sensor 223 that converts the first portion of the second composite signal to a first electrical signal. The second detector waveguide 222 carries a second portion of the second composite signal to a second light sensor 224 that converts the second portion of the second composite signal to a second electrical signal. Examples of suitable light sensors include germanium photodiodes (PDs), and avalanche photodiodes (APDs).

In some instances, the light-combining component 211 splits the first composite signal such that the portion of the comparative signal (i.e. the portion of the first portion of the comparative signal) included in the first portion of the composite signal is phase shifted by 180° relative to the portion of the comparative signal (i.e. the portion of the first portion of the comparative signal) in the second portion of the composite signal but the portion of the reference signal (i.e. the portion of the first portion of the reference signal) in the first portion of the composite signal is not phase shifted relative to the portion of the reference signal (i.e. the portion of the first portion of the reference signal) in the second portion of the composite signal. Alternately, the light-combining component 211 splits the composite signal such that the portion of the reference signal (i.e. the portion of the first portion of the reference signal) in the first portion of the composite signal is phase shifted by 180° relative to the portion of the reference signal (i.e. the portion of the first portion of the reference signal) in the second portion of the composite signal but the portion of the comparative signal (i.e. the portion of the first portion of the comparative signal) in the first portion of the composite signal is not phase shifted relative to the portion of the comparative signal (i.e. the portion of the first portion of the comparative signal) in the second portion of the composite signal.

When the second light-combining component 212 splits the second composite signal such that the portion of the comparative signal in the first portion of the second composite signal is phase shifted by 180° relative to the portion of the comparative signal in the second portion of the second composite signal, the light-combining component 211 also splits the composite signal such that the portion of the comparative signal in the first portion of the composite signal is phase shifted by 180° relative to the portion of the comparative signal in the second portion of the composite signal. When the second light-combining component 212 splits the second composite signal such that the portion of the reference signal in the first portion of the second composite signal is phase shifted by 180° relative to the portion of the reference signal in the second portion of the second composite signal, the light-combining component 211 also splits the composite signal such that the portion of the reference signal in the first portion of the composite signal is phase shifted by 180° relative to the portion of the reference signal in the second portion of the composite signal.

The first reference waveguide 210 and the second reference waveguide 208 are constructed to provide a phase shift between the first portion of the reference signal and the second portion of the reference signal. For instance, the first reference waveguide 210 and the second reference waveguide 208 can be constructed so as to provide a 90 degree phase shift between the first portion of the reference signal and the second portion of the reference signal. As an example, one reference signal portion can be an in-phase component and the other a quadrature component. Accordingly, one of the reference signal portions can be a sinusoidal function and the other reference signal portion can be a cosine function. In one example, the first reference waveguide 210 and the second reference waveguide 208 are constructed such that the first reference signal portion is a cosine function and the second reference signal portion is a sine function. Accordingly, the portion of the reference signal in the second composite signal is phase shifted relative to the portion of the reference signal in the first composite signal, however, the portion of the comparative signal in the first composite signal is not phase shifted relative to the portion of the comparative signal in the second composite signal.

The first light sensor 223 and the second light sensor 224 can be connected as a balanced detector and the first auxiliary light sensor 218 and the second auxiliary light sensor 220 can also be connected as a balanced detector. For instance, FIG. 5B provides a schematic of the relationship between the electronics, the first light sensor 223, the second light sensor 224, the first auxiliary light sensor 218, and the second auxiliary light sensor 220. The symbol for a photodiode is used to represent the first light sensor 223, the second light sensor 224, the first auxiliary light sensor 218, and the second auxiliary light sensor 220 but one or more of these sensors can have other constructions. In some instances, all of the components illustrated in the schematic of FIG. 5B are included on the LIDAR chip. In some instances, the components illustrated in the schematic of FIG. 5B are distributed between the LIDAR chip and electronics located off of the LIDAR chip.

The electronics connect the first light sensor 223 and the second light sensor 224 as a first balanced detector 225 and the first auxiliary light sensor 218 and the second auxiliary light sensor 220 as a second balanced detector 226. In particular, the first light sensor 223 and the second light sensor 224 are connected in series. Additionally, the first auxiliary light sensor 218 and the second auxiliary light sensor 220 are connected in series. The serial connection in the first balanced detector is in communication with a first data line 228 that carries the output from the first balanced detector as a first data signal. The serial connection in the second balanced detector is in communication with a second data line 232 that carries the output from the second balanced detector as a second data signal. The first data signal is an electrical representation of the first composite signal and the second data signal is an electrical representation of the second composite signal. Accordingly, the first data signal includes a contribution from a first waveform and a second waveform and the second data signal is a composite of the first waveform and the second waveform. The portion of the first waveform in the first data signal is phase-shifted relative to the portion of the first waveform in the first data signal but the portion of the second waveform in the first data signal being in-phase relative to the portion of the second waveform in the first data signal. For instance, the second data signal includes a portion of the reference signal that is phase shifted relative to a different portion of the reference signal that is included the first data signal. Additionally, the second data signal includes a portion of the comparative signal that is in-phase with a different portion of the comparative signal that is included in the first data signal. The first data signal and the second data signal are beating as a result of the beating between the comparative signal and the reference signal, i.e. the beating in the first composite signal and in the second composite signal.

The electronics 32 includes a transform mechanism 238 configured to perform a mathematical transform on the first data signal and the second data signal. For instance, the mathematical transform can be a complex Fourier transform with the first data signal and the second data signal as inputs. Since the first data signal is an in-phase component and the second data signal its quadrature component, the first data signal and the second data signal together act as a complex data signal where the first data signal is the real component and the second data signal is the imaginary component of the input.

The transform mechanism 238 includes a first Analog-to-Digital Converter (ADC) 264 that receives the first data signal from the first data line 228. The first Analog-to-Digital Converter (ADC) 264 converts the first data signal from an analog form to a digital form and outputs a first digital data signal. The transform mechanism 238 includes a second Analog-to-Digital Converter (ADC) 266 that receives the second data signal from the second data line 232. The second Analog-to-Digital Converter (ADC) 266 converts the second data signal from an analog form to a digital form and outputs a second digital data signal. The first digital data signal is a digital representation of the first data signal and the second digital data signal is a digital representation of the second data signal. Accordingly, the first digital data signal and the second digital data signal act together as a complex signal where the first digital data signal acts as the real component of the complex signal and the second digital data signal acts as the imaginary component of the complex data signal.

The transform mechanism 238 includes a transform component 268 that receives the complex data signal. For instance, the transform component 268 receives the first digital data signal from the first Analog-to-Digital Converter (ADC) 264 as an input and also receives the second digital data signal from the first Analog-to-Digital Converter (ADC) 266 as an input. The transform component 268 can be configured to perform a mathematical transform on the complex signal so as to convert from the time domain to the frequency domain. The mathematical transform can be a complex transform such as a complex Fast Fourier Transform (FFT). A complex transform such as a complex Fast Fourier Transform (FFT) provides an unambiguous solution for the shift in frequency of LIDAR input signal relative to the LIDAR output signal that is caused by the radial velocity between the reflecting object and the LIDAR chip. The electronics use the one or more frequency peaks output from the transform component 268 for further processing to generate the LIDAR data (distance and/or radial velocity between the reflecting object and the LIDAR chip or LIDAR system). The transform component 268 can execute the attributed functions using firmware, hardware or software or a combination thereof.

FIG. 5C shows an example of a relationship between the frequency of the system output signal, time, cycles and data periods. The base frequency of the system output signal ($f_o$) can be the frequency of the system output signal at the start of a cycle.

FIG. 5C shows frequency versus time for a sequence of two cycles labeled $cycle_j$ and $cycle_{j+1}$. In some instances, the frequency versus time pattern is repeated in each cycle as shown in FIG. 5C. The illustrated cycles do not include re-location periods and/or re-location periods are not located between cycles. As a result, FIG. 5C illustrates the results for a continuous scan.

Each cycle includes K data periods that are each associated with a period index k and are labeled $DP_k$. In the example of FIG. 5C, each cycle includes three data periods labeled $DP_k$ with k=1, 2, and 3. In some instances, the frequency versus time pattern is the same for the data periods that correspond to each other in different cycles as is shown in FIG. 5C. Corresponding data periods are data periods with the same period index. As a result, each data period $DP_1$ can be considered corresponding data periods and the associated frequency versus time patterns are the same in FIG. 5C. At the end of a cycle, the electronics return the frequency to the same frequency level at which it started the previous cycle.

During the data period $DP_1$, and the data period $DP_2$, the electronics operate the light source such that the frequency of the system output signal changes at a linear rate α. The direction of the frequency change during the data period $DP_1$ is the opposite of the direction of the frequency change during the data period $DP_2$.

The frequency output from the Complex Fourier transform represents the beat frequency of the composite signals that each includes a comparative signal beating against a reference signal. The beat frequencies ($f_{LDP}$) from two or more different data periods can be combined to generate the LIDAR data. For instance, the beat frequency determined from $DP_1$ in FIG. 5C can be combined with the beat frequency determined from $DP_2$ in FIG. 5C to determine the LIDAR data. As an example, the following equation applies during a data period where electronics increase the frequency of the outgoing LIDAR signal during the data period such as occurs in data period $DP_1$ of FIG. 5C: $f_{ub}=-f_d+\alpha\tau$ where $f_{ub}$ is the frequency provided by the transform component 268 ($f_{LDP}$ determined from $DP_1$ in this case), $f_d$ represents the Doppler shift ($f_d=2vf_c/c$) where $f_c$ represents the optical frequency ($f_o$), c represents the speed of light, v is the radial velocity between the reflecting object and the LIDAR system where the direction from the reflecting object toward the LIDAR system is assumed to be the positive direction, and c is the speed of light. The following equation applies during a data period where electronics decrease the frequency of the outgoing LIDAR signal such as occurs in data period $DP_2$ of FIG. 5C: $f_{db}=-f_d-\alpha\tau$ where $f_{db}$ is a frequency provided by the transform component 268 ($f_{i,LDP}$ determined from $DP_2$ in this case). In these two equations, $f_d$ and τ are unknowns. The electronics solve these two equations for the two unknowns. The radial velocity for the sample region then be quantified from the Doppler shift ($v=c*f_d/(2f_c)$) and/or the separation distance for that sample region can be quantified from $c*f_d/2$.

In some instances, more than one object is present in a sample region. In some instances when more than one object is present in a sample region, the transform may output more than one frequency where each frequency is associated with a different object. The frequencies that result from the same object in different data periods of the same cycle can be considered corresponding frequency pairs. LIDAR data can be generated for each corresponding frequency pair output by the transform. As a result separate LIDAR data can be generated for each of the objects in a sample region.

The data period labeled $DP_3$ in FIG. 5C is optional and allows the frequencies belonging to the same corresponding frequency pairs to be matched. For instance, during the feedback period in $DP_1$ for $cycle_2$ and also during the feedback period in $DP_2$ for $cycle_2$, more than one frequency pair can be matched. In these circumstances, it may not be clear which frequency peaks from $DP_2$ correspond to which frequency peaks from $DP_1$. As a result, it may be unclear which frequencies need to be used together to generate the LIDAR data for an object in the sample region. As a result, there can be a need to identify corresponding frequencies. The identification of corresponding frequencies can be performed such that the corresponding frequencies are frequencies from the same reflecting object within a sample region. The data period labeled $DP_3$ can be used to find the corresponding frequencies. LIDAR data can be generated for each pair of corresponding frequencies and is considered and/or processed as the LIDAR data for the different reflecting objects in the sample region.

An example of the identification of corresponding frequencies uses a LIDAR system where the cycles include three data periods ($DP_1$, $DP_2$, and $DP_3$) as shown in FIG. 5C. When there are two objects in a sample region illuminated by the system output signal, the transform component 268 outputs two different frequencies for $f_{ub}$: $f_{u1}$ and $f_{u2}$ during $DP_1$ and another two different frequencies for $f_{ab}$: $f_{d1}$ and $f_{d2}$ during $DP_2$. In this instance, the possible frequency pairings are: ($f_{d1}$, $f_{u1}$); ($f_{d1}$, $f_{u2}$); ($f_{d2}$, $f_{u1}$); and ($f_{d2}$, $f_{du2}$). A value of $f_d$ and τ can be calculated for each of the possible frequency pairings. Each pair of values for $f_d$ and τ can be substituted into $f_3=-f_d+\alpha_3\tau_0$ to generate a theoretical $f_3$ for each of the possible frequency pairings. The value of $\alpha_3$ is different from the value of α used in $DP_1$ and $DP_2$. In FIG. 5C, the value of $\alpha_3$ is zero. In this case, the transform components 268 also outputs two values for $f_3$ that are each associated with one of the objects in the sample region. The frequency pair with a theoretical $f_3$ value closest to each of the actual $f_3$ values is considered a corresponding pair. LIDAR data can be generated for each of the corresponding pairs as described above and is considered and/or processed as the LIDAR data for a different one of the reflecting objects in the sample region. Each set of corresponding frequencies can be used in the above equations to generate LIDAR data. The generated LIDAR data will be for one of the objects in the sample region. As a result, multiple different LIDAR data values can be generated for a sample region where each of the different LIDAR data values corresponds to a different one of the objects in the sample region.

Although FIG. 5C illustrates light-combining components that combine a portion of the reference signal with a portion of the comparative signal, the processing component can include a single light-combining component that combines the reference signal with the comparative signal so as to form a composite signal. As a result, at least a portion of the reference signal and at least a portion of the comparative signal can be combined to form a composite signal. The combined portion of the reference signal can be the entire reference signal or a fraction of the reference signal and the combined portion of the comparative signal can be the entire comparative signal or a fraction of the comparative signal.

As an example of a processing component that combines the reference signal and the comparative signal so as to form a composite signal, FIG. 5D illustrates the processing component of FIG. 5C modified to include a single light-combining component. The comparative waveguide 196 carries the comparative signal directly to the first light-combining component 211 and the reference waveguide 198 carries the reference signal directly to the first light-combining component 211.

The first light-combining component 211 combines the comparative signal and the reference signal into a composite signal. Due to the difference in frequencies between the comparative signal and the reference signal, the first composite signal is beating between the comparative signal and the reference signal. The first light-combining component 211 also splits the composite signal onto the first detector waveguide 221 and the second detector waveguide 222. The first detector waveguide 221 carries a first portion of the composite signal to the first light sensor 223 that converts the first portion of the second composite signal to a first electrical signal. The second detector waveguide 222 carries a second portion of the composite signal to the second light sensor 224 that converts the second portion of the second composite signal to a second electrical signal.

FIG. 5E provides a schematic of the relationship between the electronics, the first light sensor 223, and the second light sensor 224. The symbol for a photodiode is used to represent the first light sensor 223, and the second light sensor 224 but one or more of these sensors can have other constructions. In some instances, all of the components illustrated in the schematic of FIG. 5E are included on the LIDAR chip. In some instances, the components illustrated in the schematic of FIG. 5E are distributed between the LIDAR chip and electronics located off of the LIDAR chip.

The electronics connect the first light sensor 223 and the second light sensor 224 as a first balanced detector 225. In particular, the first light sensor 223 and the second light sensor 224 are connected in series. The serial connection in the first balanced detector is in communication with a first data line 228 that carries the output from the first balanced detector as a first data signal. The first data signal is an electrical representation of the composite signal.

The electronics 32 include a transform mechanism 238 configured to perform a mathematical transform on the first data signal. The mathematical transform can be a real Fourier transform with the first data signal as an input. The electronics can use the frequency output from the transform as described above to extract the LIDAR data.

Each of the balanced detectors disclosed in the context of FIG. 5A through FIG. 5E can be replaced with a single light sensor. As a result, the processing component can include one or more light sensors that each receives at least a portion of a composite signal in that the received portion of the composite signal can be the entire composite signal or a fraction of the composite signal.

As discussed in the context of FIG. 5C, the electronics 32 tune the frequency of the system output signal. One method to produce this frequency chirp is to modulate the electrical current applied to the light source by the electronics. In semiconductor lasers that can be used as the light source in the LIDAR system, current modulation results in frequency modulation via strong nonlinear carrier/photon coupling. However, this effect also produces an intensity modulation together with the frequency modulation. This intensity modulation may be nonlinear, even if the frequency variation is made to be linear. As a result, tuning the frequency of the system output signal can cause changes to the amplitude of the system output signal.

Changes to the amplitude of the system output signal cause variations in the amplitude of the composite signals. These variations in the amplitude of the composite signal cause the mathematical transforms performed by the transform component(s) 268 to output frequencies in addition to the one or more frequencies that provide the correct LIDAR data. Because it can be difficult to identify which frequencies are the correct frequencies, variations in the amplitude of the composite signals can reduce the reliability of the LIDAR data quantified by the electronics. As a result, variations in the amplitude of the system output signal can reduce the reliability of the LIDAR data results.

The above LIDAR systems each include an amplifier 8. The electronics can operate the amplifiers 8. The amplifiers 8 can be amplitude amplifiers. Accordingly, in the LIDAR system of FIG. 1A through FIG. 1D and FIG. 1F, the electronics can operate an amplifier so as to increase the power of the outgoing LIDAR signal. As a result, the amplifier(s) can increase the power of the LIDAR output signal and the system output signal. In the LIDAR system of FIG. 1E, the electronics can operate an amplifier so as to increase the power of the amplified LIDAR output signal and accordingly the system output signal. When a LIDAR system includes multiple amplifiers (not shown) on an amplifier chip, the electronics can operate the amplifiers independently. Alternately, the electronics can operate the amplifiers concurrently. As an example of concurrent operation of the amplifiers, the electronics operate amplifiers connected in series or in parallel.

The electronics can operate the amplifier(s) in the saturation mode. Operating the amplifier(s) in the saturation mode can reduce or eliminate variations that occur in the amplitude of the system output signal in response to chirping the frequency of the system output signal. Each of the amplifiers 8 illustrated above receives a pre-amplifier signal and outputs an amplified light signal. In the LIDAR systems of FIG. 1A through FIG. 1D and FIG. 1F, the preliminary outgoing LIDAR signal serves as the pre-amplifier signal. In the LIDAR system of FIG. 1E, the LIDAR output signal serves as the pre-amplifier signal. In the LIDAR systems of FIG. 1A through FIG. 1C and FIG. 1F, the outgoing LIDAR signal serves as the amplified light signal. In the LIDAR system of FIG. 1D, the amplified preliminary outgoing LIDAR signal serves as amplified light signal. In the LIDAR system of FIG. 1E, the amplified LIDAR output signal serves as the amplified light signal.

Figure 6A:
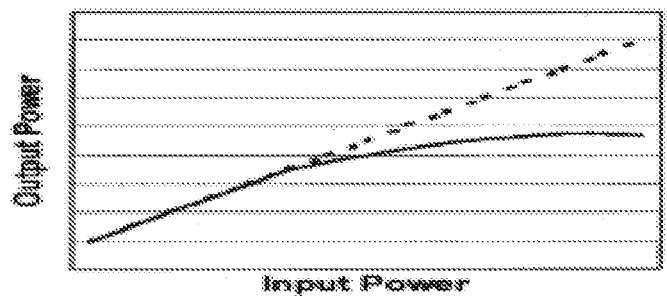
FIG. 6A is a graph showing output power versus input power for an optical amplifier.

FIG. 6A is an example of graph illustrating the performance for an optical amplifier that is suitable for use in the LIDAR systems. The graph includes a curve showing the output power of the amplifier as a function of the input power to the amplifier. The curve includes a linear region and a non-linear region. In the linear region, the gain (G=Pout/Pin) remains constant or substantially constant. In the non-linear region, the level of gain begins to drop.

Figure 6B:
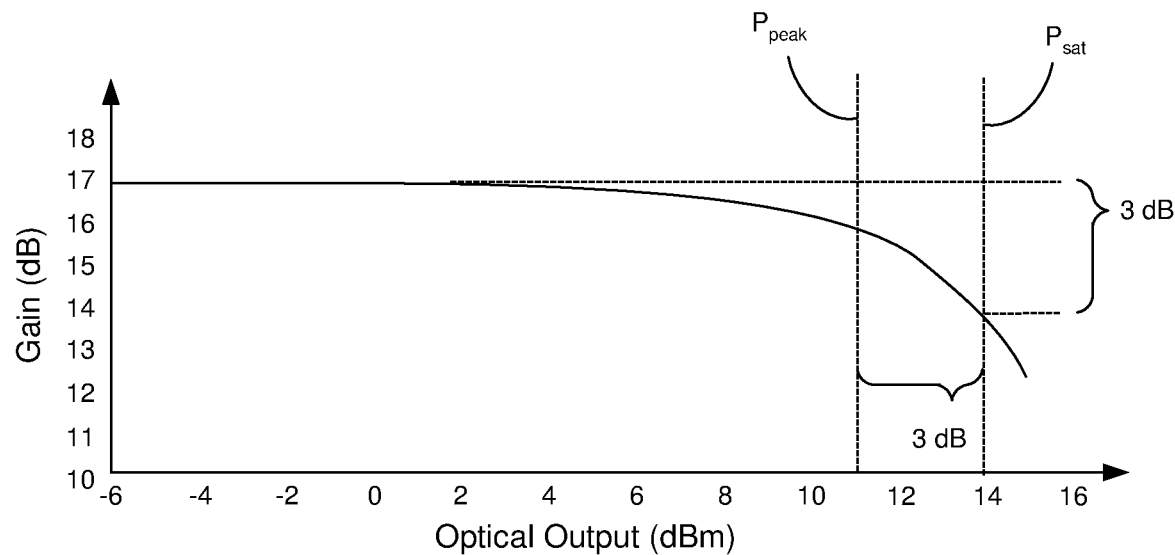
FIG. 6B is a graph showing gain versus output power for an optical amplifier.

FIG. 6B is a graph where the constant gain level in the linear region of FIG. 6A is readily evident. The graph in FIG. 6B is showing the amplifier gain provided by a suitable amplifier as a function of the power of the amplified light signal (Pout). The curve in FIG. 6B includes a linear (unsaturated) region and a saturation region. The saturation region starts when the gain level drops by 3 dB relative to the maximum gain level that can be achieved in the linear mode. The maximum power that can be achieved for the amplified light signal (Pout) is generally approximately 3 dB higher than the saturation power (Psat). The peak power that can be achieved while operating in the linear region is generally at or about 3 dB lower than the saturation power (Psat).

When operating an amplifier in the linear mode and at a constant level of electrical current through the amplifier, the gain level stays constant or substantially constant in response to changes in the pre-amplifier signal power. As a result, changes to the amplitude of the pre-amplifier signal are evident in the amplitude of the amplified light signal. In contrast, when operating an amplifier in the saturation mode, the gain is reduced by at least 3 dB relative to the maximum gain level that can be achieved in the linear mode. As a result, the variations in the amplitude of the amplified light signal are reduced relative to the variations that would be present with the amplifier operating in the linear mode. Further, when operating an amplifier in the saturation mode, the variations in the amplitude of the amplified light signal in response to variations in the amplitude of the pre-amplifier signal are reduced and can be eliminated or substantially eliminated. For instance, the amplifier can be operated at a location in the saturation mode where an increase in the amplitude of the pre-amplifier signal of 28% or more results in less than an 14% increase in the amplitude of the amplified light signal; or an increase in the amplitude of the pre-amplifier signal of 22% or more results in less than an 12% increase in the amplitude of the amplified light signal; or an increase in the amplitude of the pre-amplifier signal of 27% or more results in less than an 11% increase in the amplitude of the amplified light signal.

While the amplitude of the amplified light signal does not substantially change in response to changes in amplitude of the pre-amplifier signal, the frequency of the amplified light signal does change in response to changes in the frequency of the pre-amplifier signal. As a result, the electronics can tune the frequency of the amplified light signal without substantial changes to the amplitude of the amplified light signal. Since the amplifier receives light that becomes the system output signal and/or light that becomes the LIDAR output signal, the electronics can operate the light source so as to tune the frequency of the system output signal and/or the LIDAR output signal without substantially changing the amplitude of the system output signal and/or the LIDAR output signal.

In the LIDAR systems of FIG. 1A through FIG. 1D, and FIG. 1F, the amplified light signal serves as the outgoing LIDAR signal. Light from the outgoing LIDAR signal is included in the reference signal, the system output signal, and the comparative signal. Since the electronics can tune the frequency of the outgoing LIDAR signal without substantially changing the amplitude of the outgoing LIDAR signal, the electronics can tune the frequency of the reference signal without substantially changing the amplitude of the reference signal, the electronics can tune the frequency of the system output signal without substantially changing the amplitude of the system output signal, and the electronics can tune the frequency of the comparative signal without substantially changing the amplitude of the comparative signal. Since the composite signal(s) include a contribution from the reference signal and the comparative signal, changing the frequency of the LIDAR output signal as shown in FIG. 5C does not result in substantial changes to the amplitude of the composite signals. Since the amplitude of the composite signals does not substantially change in response to changes in the frequency of the system output signal, the output of false frequencies from the transform component is reduced or eliminated. As a result, operating the amplifiers in the saturated state can improve the reliability of the LIDAR data results.

In the LIDAR system of FIG. 1E, the amplified light signal can serve as the system output signal. As a result, the electronics can tune the frequency of the system output signal without substantially changing the amplitude of the system output signal. Light from the system output signal is included in the comparative signal. Since the electronics can tune the frequency of the system output signal without substantially changing the amplitude of the system output signal, the electronics can tune the frequency of the comparative signal without substantially changing the amplitude of the comparative signal. In contrast, light from the system output signal is not included in the reference signal. For instance, the light in the reference signal does not pass through the amplifier. As a result, the reference signal can include changes in amplitude that result from tuning the frequency of the system output signal. Accordingly, the composite signals generated in the LIDAR system of FIG. 1E may show some changes in amplitude that result from tuning the frequency of the system output signal.

In optical amplifiers, the amplified light signal power can be a function of both the electrical current through the amplifier and the pre-amplifier signal power to the amplifier. For instance, increasing the electrical current through the amplifier can increase the amplified light signal power and increasing the pre-amplifier signal power can increase the amplified light signal power. Accordingly, operating an amplifier in the saturated mode can result from selecting the electrical current through the amplifier and the pre-amplifier signal power so as to achieve the desired level of saturation.

When the amplifier is operated in the saturated mode, the passage of variations in the amplitude of the pre-amplifier signal through the amplifier are reduced, eliminated, or substantially eliminated. As a result, the amplifier effectively fixes the amplitude of the amplified light signal at the first amplitude seen by the amplifier. The amplifier can optionally be set up to output amplified light signals at an operational amplitude. For instance, the electronics can pass the operational electrical current level through the amplifier. A light signal with the operational amplitude can then be passed through the amplifier. The amplifier can then be operated at the operational electrical current. An example of a suitable operational amplitude can be the amplitude of the outgoing LIDAR signal or the system output signal when the outgoing LIDAR signal or the system output signal has the frequency $f_o$ (labeled in FIG. 5C).

Figure 7:
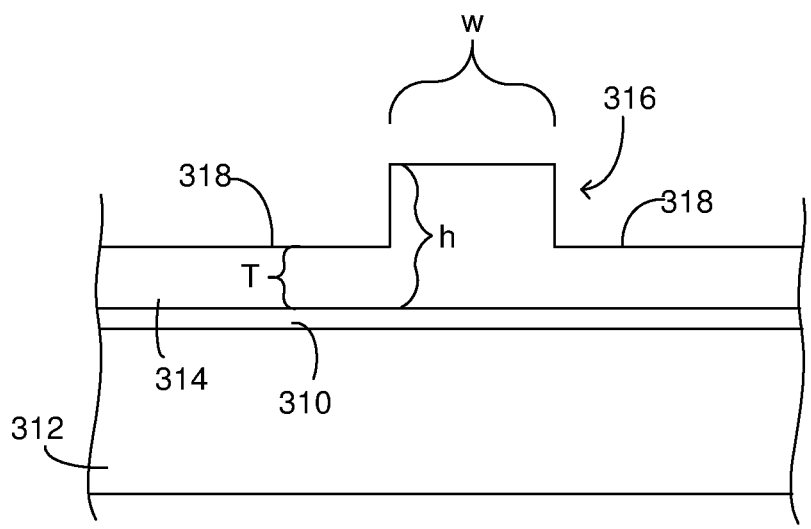
FIG. 7 is a cross-section of portion of a LIDAR chip that includes a waveguide on a silicon-on-insulator platform.

Suitable platforms for the LIDAR chips include, but are not limited to, silica, indium phosphide, and silicon-on-insulator wafers. FIG. 7 is a cross-section of portion of a chip constructed from a silicon-on-insulator wafer. A silicon-on-insulator (SOI) wafer includes a buried layer 310 between a substrate 312 and a light-transmitting medium 314. In a silicon-on-insulator wafer, the buried layer 310 is silica while the substrate 312 and the light-transmitting medium 314 are silicon. The substrate 312 of an optical platform such as an SOI wafer can serve as the base for the entire LIDAR chip. For instance, the optical components shown on the LIDAR chips of FIG. 1A through FIG. 1D can be positioned on or over the top and/or lateral sides of the substrate 312.

FIG. 7 is a cross section of a portion of a LIDAR chip that includes a waveguide construction that is suitable for use in LIDAR chips constructed from silicon-on-insulator wafers. A ridge 316 of the light-transmitting medium extends away from slab regions 318 of the light-transmitting medium. The light signals are constrained between the top of the ridge 316 and the buried oxide layer 310.

The dimensions of the ridge waveguide are labeled in FIG. 7. For instance, the ridge has a width labeled w and a height labeled h. A thickness of the slab regions is labeled T. For LIDAR applications, these dimensions can be more important than other dimensions because of the need to use higher levels of optical power than are used in other applications. The ridge width (labeled w) is greater than 1 µm and less than 4 µm, the ridge height (labeled h) is greater than 1 µm and less than 4 µm, the slab region thickness is greater than 0.5 µm and less than 3 µm. These dimensions can apply to straight or substantially straight portions of the waveguide, curved portions of the waveguide and tapered portions of the waveguide(s). Accordingly, these portions of the waveguide will be single mode. However, in some instances, these dimensions apply to straight or substantially straight portions of a waveguide. Additionally or alternately, curved portions of a waveguide can have a reduced slab thickness in order to reduce optical loss in the curved portions of the waveguide. For instance, a curved portion of a waveguide can have a ridge that extends away from a slab region with a thickness greater than or equal to 0.0 µm and less than 0.5 µm. While the above dimensions will generally provide the straight or substantially straight portions of a waveguide with a single-mode construction, they can result in the tapered section(s) and/or curved section(s) that are multi-mode. Coupling between the multi-mode geometry to the single mode geometry can be done using tapers that do not substantially excite the higher order modes. Accordingly, the waveguides can be constructed such that the signals carried in the waveguides are carried in a single mode even when carried in waveguide sections having multi-mode dimensions. The waveguide construction disclosed in the context of FIG. 7 is suitable for all or a portion of the waveguides on LIDAR chips constructed according to FIG. 1A through FIG. 1D.

The one or more amplifiers 8 can be integrated onto the platform of the LIDAR chip. For instance, the one or more amplifiers 8 can be integrated onto LIDAR chip constructed on a silicon-on-insulator wafer. An example of an amplifier construction that can be integrated onto a silicon-on-insulator wafer can be found in U.S. patent application Ser. No. 13/317,340, filed on Oct. 14 2011, entitled Gain Medium Providing Laser and Amplifier Functionality to Optical Devices, and incorporated herein in its entirety.

In some instances, the one or more amplifiers 8 are included on a chip that is separate from the LIDAR chip and attached to the LIDAR chip. A suitable method for attaching a chip that includes one or more amplifiers to a LIDAR chip includes, but is not limited to, flip chip bonding.

Figure 8A:
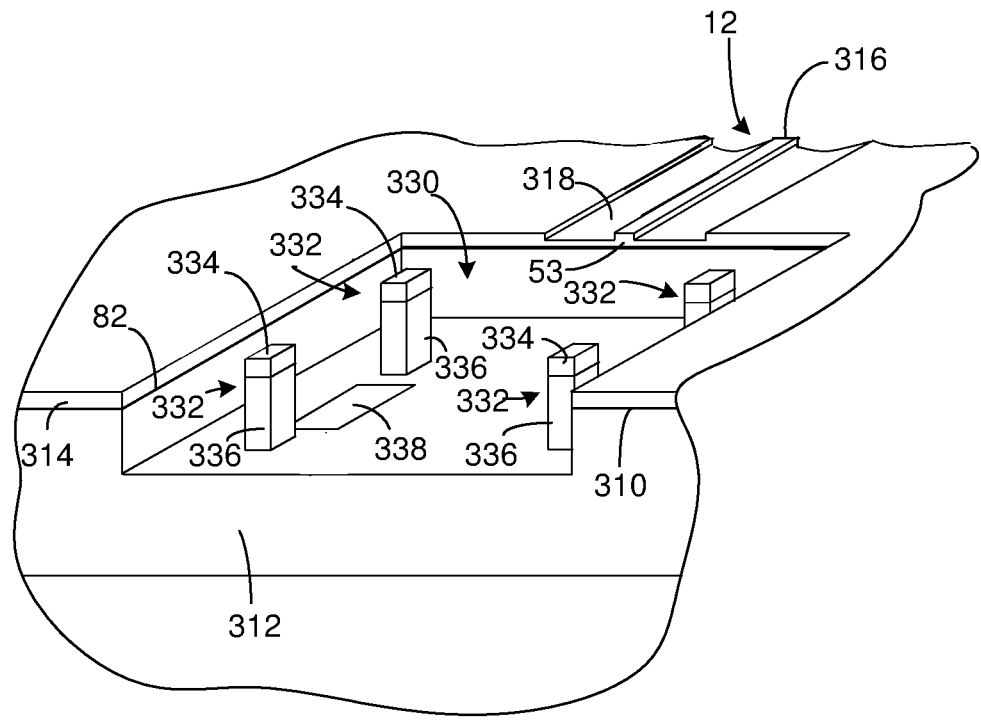
FIG. 8A is a perspective view of a portion of a LIDAR chip that includes an interface for optically coupling the LIDAR chip with an amplifier.

FIG. 8A is a perspective view of a portion of a LIDAR chip that includes an interface for optically coupling a LIDAR chip with an amplifier chip. The illustrated portion of the LIDAR chip includes a stop recess 330 sized to receive the auxiliary device. The stop recess 330 extends through the light-transmitting medium 314 and into a base of the LIDAR chip. In the illustrated version, the stop recess 330 extends through the light-transmitting medium 314, the buried layer 310, and into the substrate 312.

The second facet 53 of the utility waveguide 12 serves as a lateral side of the stop recess 330. Although not shown, the second facet 53 of the utility waveguide 12 can include an anti-reflective coating. A suitable anti-reflective coating includes, but is not limited to, single-layer coatings such as silicon nitride or aluminum oxide, or multi-layer coatings, which may contain silicon nitride, aluminum oxide, and/or silica.

One or more stops 332 extend upward from a bottom of the stop recess 330. For instance, FIG. 8A illustrates four stops 332 extending upward from the bottom of the stop recess 330. The stops 332 include a cladding 334 positioned on a base portion 336. The substrate 312 can serve as the base portion 336 of the stops 332 and the stop 332 can exclude the buried layer 310. The portion of the substrate 312 included in the stops 332 can extend from the bottom of the stop recess 330 up to the level of the buried layer 310. For instance, the stops 332 can be formed by etching through the buried layer 310 and using the underlying substrate 312 as an etch-stop. As a result, the location of the top of the base portion 336 relative to the optical mode of a light signal in the utility waveguide 12 is well known because the buried layer 310 defines the bottom of the second waveguide and the top of the base portion 336 is located immediately below the buried layer 310. The cladding 334 can be formed on base portion 336 of the stops 332 so as to provide the stops 332 with a height that will provide the desired alignment between the utility waveguide 12 and an amplifier waveguide on an amplifier chip.

Attachment pads 338 are positioned on the bottom of the stop recess 330. The attachment pads 338 can be used to immobilize the amplifier chip relative to the LIDAR chip once the amplifier chip is positioned on the LIDAR chip. In some instances, the attachment pads 338 also provide electrical communication between the LIDAR chip and one or more amplifiers on an amplifier chip. Suitable attachment pads 338 include, but are not limited to, solder pads.

Figure 8B:
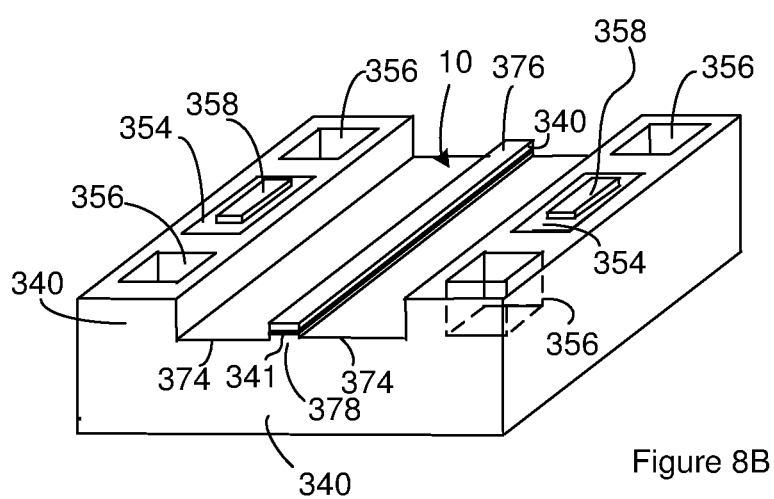
FIG. 8B is a perspective view of an amplifier chip suitable for use with the portion of the LIDAR chip shown in FIG. 8A.

FIG. 8B is a perspective view of one embodiment of an amplifier chip. The illustrated amplifier chip is within the class of devices known as planar optical devices. The amplifier chip includes an amplifier waveguide 10 defined in a gain medium 340. Suitable gain media include, but are not limited to, InP, InGaAsP, and GaAs.

Trenches 374 extending into the gain medium 340 define a ridge 376 in the gain medium 340. The ridge 376 defines the amplifier waveguide 10. In some instances, the gain medium 340 includes one or more layers 341 in the ridge and/or extending across the ridge 376. The one or more layers 341 can be positioned between different regions of the gain medium 340. The region of the gain medium 340 above the one or more layers 341 can be the same as or different from the region of the gain medium 340 below the one or more layers 341. The layers can be selected to constrain light signals guided through the amplifier waveguide 10 to a particular location relative to the ridge 376. Each of the layers 341 can have a different composition of a material that includes or consists of two or more components of selected from a group consisting of In, P, Ga, and As. In one example, the gain medium 340 is InP and the one or more layers 341 each includes Ga and As in different ratios.

The amplifier waveguide 10 provides an optical pathway between a first facet 378 and a second facet 380. Although not shown, the first facet 378 and/or the second facet 380 can optionally include an anti-reflective coating. A suitable anti-reflective coating includes, but is not limited to, single-layer coatings such as silicon nitride or aluminum oxide, or multi-layer coatings that may contain silicon nitride, aluminum oxide, and/or silica.

The amplifier chip includes one or more attachment pads 354 that can be employed to immobilize the amplifier chip relative to the LIDAR chip. Suitable attachment pads 354 include, but are not limited to, solder pads.

The amplifier chip also includes one or more alignment recesses 356. The dashed lines in FIG. 8B show the depth and shape of one of the alignment recesses 356.

Figure 8C:
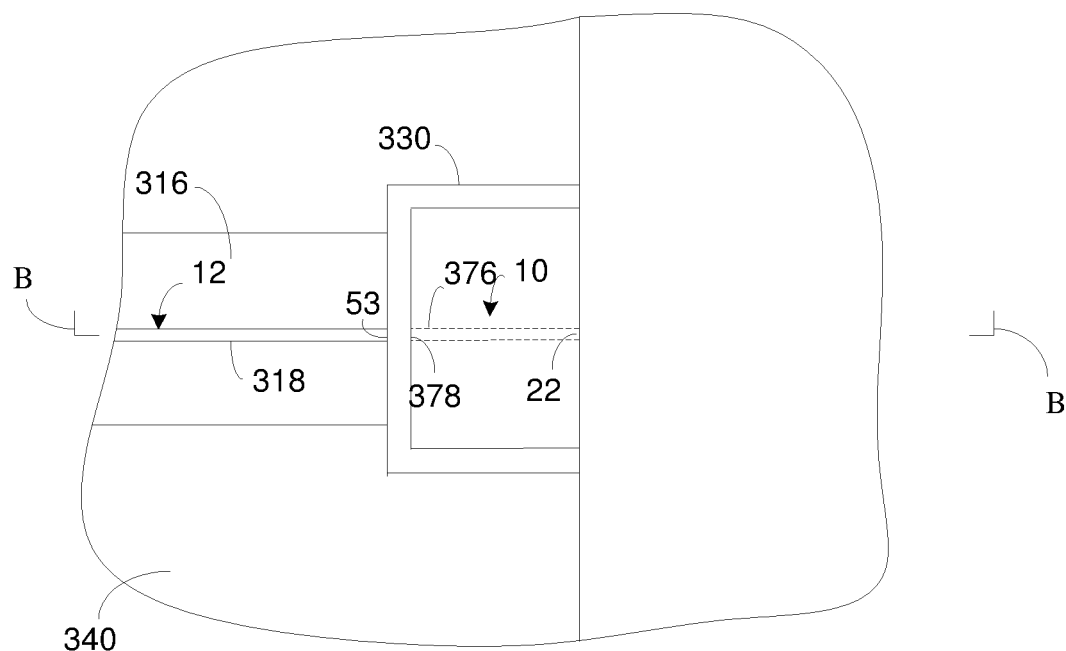
FIG. 8C and FIG. 8D illustrate system that includes the LIDAR chip of FIG. 8A interfaced with the amplifier of FIG. 8B.
Figure 8D:
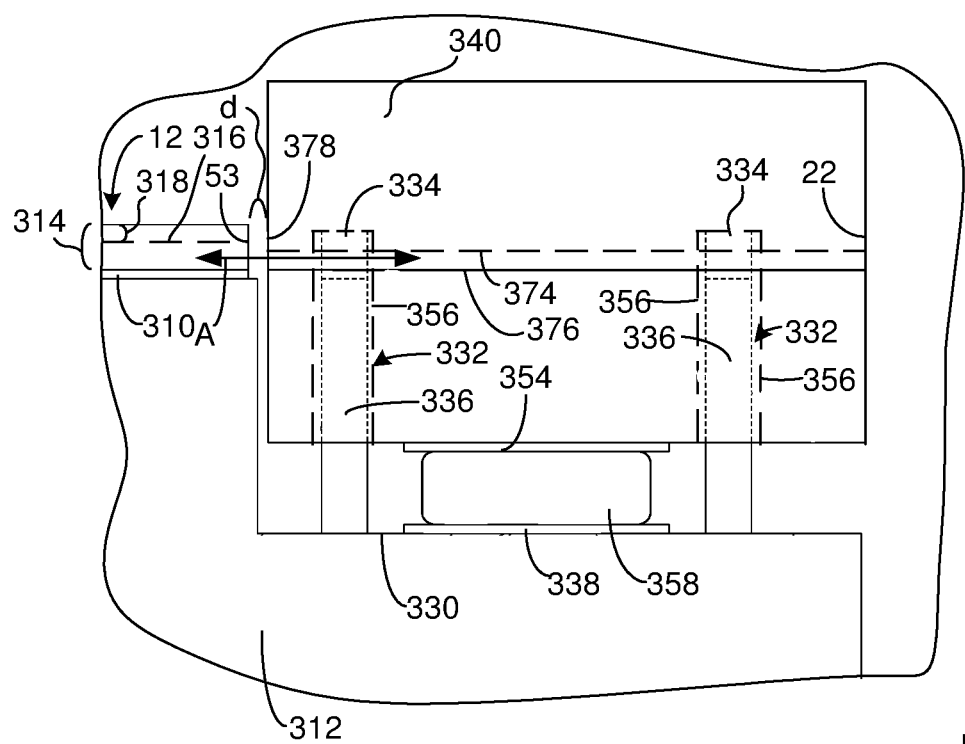

FIG. 8C and FIG. 8D illustrate a LIDAR system that includes the LIDAR chip of FIG. 8A interface with the amplifier chip of FIG. 8B. FIG. 8C is a topview of the LIDAR system. FIG. 8D is a sideview of a cross section of the system taken through the utility waveguide 12 on the LIDAR chip and the amplifier waveguide 10 on the amplifier chip. For instance, the cross section of FIG. 8D can be taken along a line extending through the brackets labeled B in FIG. 8C. FIG. 8C and FIG. 8D each includes dashed lines that illustrate features that are located behind other features in the system. For instance, FIG. 8C includes dashed lines showing the ridge 376 of the amplifier waveguide 10 even though the ridge 376 is located under the gain medium 340. Additionally, FIG. 8D includes dashed lines that illustrate the locations of the portion of the stops 332 and alignment recesses 356 located behind the ridge 376 of the amplifier waveguide 10. FIG. 8D also includes dashed lines that illustrate the location where the ridge 316 of the utility waveguide 12 interfaces with the slab regions 318 that define the utility waveguide 12. Additionally, dashed lines illustrate the location where the ridge 376 of the amplifier waveguide 10 interfaces with slab regions 374 of the amplifier chip.

The amplifier chip is positioned in the stop recess 330 on the LIDAR chip. The amplifier chip is positioned such that the ridge 376 of the amplifier waveguide 10 is located between the bottom of the amplifier chip and the substrate of the LIDAR chip. Accordingly, the amplifier chip is inverted in the stop recess 330. Solder or other adhesive 358 contacts the attachment pads 338 on the bottom of the stop recess 330 and the attachment pads 354 on the amplifier chip. For instance, the solder or other adhesive 358 extends from an attachment pad 338 on the bottom of the stop recess 330 to an attachment pad 354 on the auxiliary device. Accordingly, the solder or other adhesive 358 immobilizes the auxiliary device relative to the LIDAR chip.

The second facet 53 of the utility waveguide 12 is aligned with a first facet 378 of the amplifier waveguide 10 such that the utility waveguide 12 and the amplifier waveguide 10 can exchange light signals. As shown by the line labeled A, the system provides a horizontal transition path in that the direction that light signals travel between the LIDAR chip and the amplifier chip is parallel or is substantially parallel relative to an upper and/or lower surface of the base 21. A top of the first facet 378 of the amplifier waveguide 10 is at a level that is below the top of the second facet 53 of the utility waveguide.

The one or more stops 332 on the LIDAR chip are each received within one of the alignment recesses 356 on the auxiliary device. The top of each stop 332 contacts the bottom of the alignment recess 356. As a result, the interaction between stops 332 and the bottom of the alignment recesses 356 prevent additional movement of the amplifier chip toward the LIDAR chip. In some instances, the auxiliary device rests on top of the stops 332.

As is evident from FIG. 8D, the first facet 378 of the amplifier waveguide 10 is vertically aligned with the second facet 53 of the utility waveguide 12 on the LIDAR chip. As is evident from FIG. 8C, the first facet 378 of the amplifier waveguide 10 is horizontally aligned with the second facet 53 of the utility waveguide 12 on the LIDAR chip. The horizontal alignment can be achieved by alignment of marks and/or features on the amplifier chip and the LIDAR chip.

The vertical alignment can be achieved by controlling the height of the stops 332 on the LIDAR chip. For instance, the cladding 334 on the base portion 336 of the stops 332 can be grown to the height that places the first facet 378 of the amplifier waveguide 10 at a particular height relative to the second facet 53 of the utility waveguide 12 on the LIDAR chip. The desired cladding 334 thickness can be accurately achieved by using deposition techniques such as evaporation, plasma enhanced chemical vapor deposition (PECVD), and/or sputtering to deposit the one or more cladding layers. As a result, one or more cladding layers can be deposited on the base portion 336 of the stops 332 so as to form the stops 332 to a height that provides the desired vertical alignment. Suitable materials for layers of the cladding 334 include, but are not limited to, silica, silicon nitride, and polymers.

In FIG. 1D, the first facet 378 is spaced apart from the second facet 53 by a distance labeled D. Since the amplifier waveguide is optically aligned with only one waveguide, the first facet 378 can be closer to the second facet 53 than was possible with prior configurations. For instance, the distance between the first facet 378 and the second facet 53 can be less than 5 µm, 3 µm, or 1 µm and/or greater than 0.0 µm. In FIG. 1D, the atmosphere in which the LIDAR chip is positioned is located in the gap between the first facet 378 and the second facet 53; however, other gap materials can be positioned in the gap. For instance, a solid gap material can be positioned in the gap. Examples of suitable gap materials include, but are not limited to, epoxies and polymers.

Figure 9:
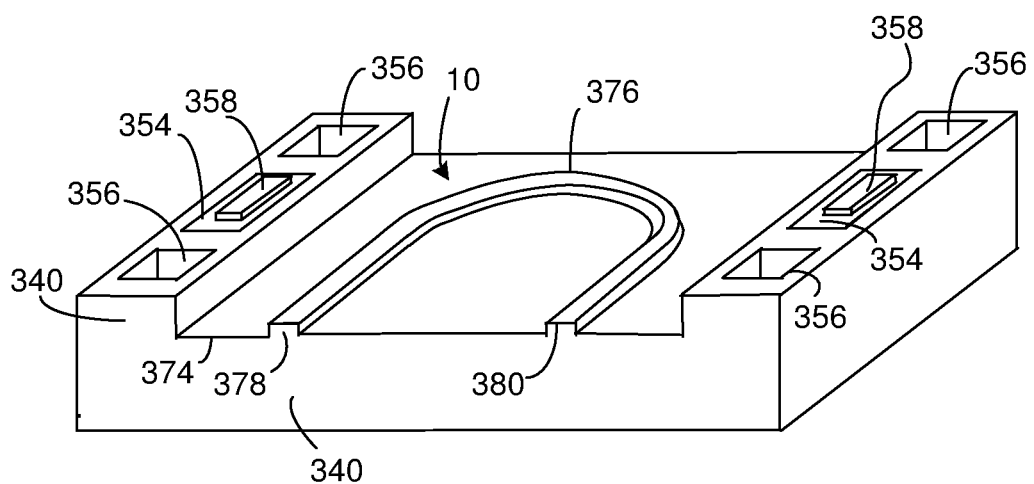
FIG. 9 is a perspective view of the amplifier chip of FIG. 8B through FIG. 8D modified such that an angle between the direction that the light signal travels when entering the amplifier waveguide and the direction that the light signal travels when exiting the amplifier waveguide is less than 180°.

The amplifier chip of FIG. 8B through FIG. 8D can be modified such that the angle between the direction that the light signal travels when entering the amplifier waveguide 10 and the direction that the light signal travels when exiting the amplifier waveguide 10 is less than 180° to provide an amplifier chip that is suitable for use in the LIDAR system of FIG. 1A through FIG. 1C and FIG. 4. For instance, FIG. 9 is a perspective view of the amplifier chip of FIG. 8B through FIG. 8D modified such that the direction that the light signal travels when entering the amplifier waveguide 10 is parallel or essentially parallel to a direction that the light signal travels when exiting the amplifier waveguide 10. As a result, the angle between the direction that the outgoing LIDAR signal travels when entering the amplifier waveguide and the direction that the outgoing LIDAR signal travels when exiting the amplifier waveguide is 0°. The amplifier chip includes multiple lateral sides between a topside and a bottom side. A light signal enters the amplifier waveguide 10 through the same lateral side through which the light signal exits the amplifier waveguide 10.

Light sensors that are interfaced with waveguides on a LIDAR chip can be a component that is separate from the chip and then attached to the chip. For instance, the light sensor can be a photodiode, or an avalanche photodiode. Examples of suitable light sensor components include, but are not limited to, InGaAs PIN photodiodes manufactured by Hamamatsu located in Hamamatsu City, Japan, or an InGaAs APD (Avalanche Photo Diode) manufactured by Hamamatsu located in Hamamatsu City, Japan. These light sensors can be centrally located on the LIDAR chip. Alternately, all or a portion the waveguides that terminate at a light sensor can terminate at a facet located at an edge of the chip and the light sensor can be attached to the edge of the chip over the facet such that the light sensor receives light that passes through the facet. The use of light sensors that are a separate component from the chip is suitable for all or a portion of the light sensors selected from the group consisting of the first auxiliary light sensor 218, the second auxiliary light sensor 220, the first light sensor 223, and the second light sensor 224.

As an alternative to a light sensor that is a separate component, all or a portion of the light sensors can be integrated with the chip. For instance, examples of light sensors that are interfaced with ridge waveguides on a chip constructed from a silicon-on-insulator wafer can be found in Optics Express Vol. 15, No. 21, 13965-13971 (2007); U.S. Pat. No. 8,093,080, issued on Jan. 10 2012; U.S. Pat. No. 8,242,432, issued Aug. 14 2012; and U.S. Pat. No. 6,108,472, issued on Aug. 22, 2000 each of which is incorporated herein in its entirety. The use of light sensors that are integrated with the chip are suitable for all or a portion of the light sensors selected from the group consisting of the auxiliary light sensor 218, the second auxiliary light sensor 220, the first light sensor 223, and the second light sensor 224.

The light source 4 that is interfaced with the utility waveguide 12 can be a laser chip that is separate from the LIDAR chip and then attached to the LIDAR chip. For instance, the light source 4 can be a laser chip that is attached to the chip using a flip-chip arrangement. Use of flip-chip arrangements is suitable when the light source 4 is to be interfaced with a ridge waveguide on a chip constructed from silicon-on-insulator wafer. Alternately, the utility waveguide 12 can include an optical grating (not shown) such as Bragg grating that acts as a reflector for an external cavity laser. In these instances, the light source 4 can include a gain element that is separate from the LIDAR chip and then attached to the LIDAR chip in a flip-chip arrangement. Examples of suitable interfaces between flip-chip gain elements and ridge waveguides on chips constructed from silicon-on-insulator wafer can be found in U.S. Pat. No. 9,705,278, issued on Jul. 11, 2017 and in U.S. Pat. No. 5,991,484 issued on Nov. 23, 1999; each of which is incorporated herein in its entirety. When the light source 4 is a gain element or laser chip, the electronics 32 can change the frequency of the outgoing LIDAR signal by changing the level of electrical current applied to through the gain element or laser cavity.

Suitable electronics 32 can include, but are not limited to, a controller that includes or consists of analog electrical circuits, digital electrical circuits, processors, microprocessors, digital signal processors (DSPs), Field Programmable Gate Arrays (FPGAs), computers, microcomputers, or combinations suitable for performing the operation, monitoring and control functions described above. In some instances, the controller has access to a memory that includes instructions to be executed by the controller during performance of the operation, control and monitoring functions. Although the electronics are illustrated as a single component in a single location, the electronics can include multiple different components that are independent of one another and/or placed in different locations. Additionally, as noted above, all or a portion of the disclosed electronics can be included on the chip including electronics that are integrated with the chip.

The above LIDAR systems include multiple optical components such as a LIDAR chip, LIDAR adapters, light source, light sensors, waveguides, and amplifiers. In some instances, the LIDAR systems include one or more passive optical components in addition to the illustrated optical components or as an alternative to the illustrated optical components. The passive optical components can be solid-state components that exclude moving parts. Suitable passive optical components include, but are not limited to, lenses, mirrors, optical gratings, reflecting surfaces, splitters, demulitplexers, multiplexers, polarizers, polarization splitters, and polarization rotators. In some instances, the LIDAR systems include one or more active optical components in addition to the illustrated optical components or as an alternative to the illustrated optical components. Suitable active optical components include, but are not limited to, optical switches, phase tuners, attenuators, steerable mirrors, steerable lenses, tunable demulitplexers, tunable multiplexers.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A LIDAR system, comprising:
multiple optical components, at least one of the optical components configured to output a system output signal that travels away from the LIDAR system and can be reflected by an object located outside of the LIDAR system such that light reflected from the object returns to the LIDAR system as a system return signal, the optical components configured to combine light from the system return signal with light from a reference signal, the reference signal including light that has not exited from the LIDAR system, the optical components include an amplifier that receives a pre-amplifier signal and outputs an amplified light signal, the pre-amplifier signal having a varying amplitude and a varying frequency,
the system output signal including light from the amplified light signal;
electronics configured to operate the amplifier in a saturated state during a period of time when the amplifier outputs the amplified light signal; and
a LIDAR chip configured to guide an outgoing LIDAR signal, the system output signal including light from the outgoing LIDAR signal,
the amplifier being included on an amplifier chip,
the amplifier chip being included on the LIDAR chip and being positioned at an edge of the LIDAR chip such that the amplified light signal exits from the LIDAR chip upon exiting from the amplifier chip.

2. The system of claim 1, wherein the system output signal consists of light from the amplified light signal.

3. The system of claim 1, wherein the electronics are configured to generate LIDAR data for the object, the LIDAR data indicating a radial velocity and/or distance between the object and the LIDAR system.

4. A LIDAR system, comprising:
one or more optical components configured to output a system output signal that travels away from the LIDAR system and can be reflected by an object located outside of the LIDAR system such that light reflected from the object returns to the LIDAR system as a system return signal, the optical components configured to combine light from the system return signal with light from a reference signal, the reference signal including light that has not exited from the LIDAR system; and the LIDAR system including an amplifier that receives a pre-amplifier signal and outputs an amplified light signal, the pre-amplifier signal having a varying amplitude and a varying frequency, the system output signal including light from the amplified light signal; and electronics configured to operate the amplifier in a saturated state during a period of time when the amplifier outputs the amplified light signal; and a LIDAR chip configured to guide an outgoing LIDAR signal, the system output signal including light from the outgoing LIDAR signal, the amplifier being included on an amplifier chip, the amplifier chip being included on the LIDAR chip and being positioned at an edge of the LIDAR chip such that the amplified light signal exits from the LIDAR chip upon exiting from the amplifier chip.

5. The system of claim 4, wherein the system output signal consists of light from the amplified light signal.

6. The system of claim 4, wherein the electronics are configured to generate LIDAR data for the object, the LIDAR data indicating a radial velocity and/or distance between the object and the LIDAR system.

7. The system of claim 4, wherein the reference signal includes light from an outgoing LIDAR signal and the system return signal includes light from the outgoing LIDAR signal.

8. The system of claim 4, wherein the LIDAR chip is constructed on a silicon-on-insulator platform.

9. The system of claim 1, wherein the amplitude of the pre-amplifier signal is modulated.

10. The system of claim 1, wherein a frequency of the pre-amplifier signal is linearly modulated.

11. The system of claim 1, wherein an amplitude of the amplified light signal is constant.

12. The system of claim 4, wherein a frequency of the pre-amplifier signal is linearly modulated.

13. The system of claim 4, wherein the amplifier chip is positioned in a recess on the LIDAR chip such that the recess does not surround lateral sides of the amplifier chip.

14. The system of claim 1, wherein the LIDAR chip is positioned in a recess on the LIDAR chip such that the recess does not surround lateral of the amplifier chip.

15. A LIDAR system, comprising:
multiple optical components, at least one of the optical components configured to output a system output signal that travels away from the LIDAR system and can be reflected by an object located outside of the LIDAR system such that light reflected from the object returns to the LIDAR system as a system return signal, the optical components configured to combine light from the system return signal with light from a reference signal, the reference signal including light that has not exited from the LIDAR system, the optical components include an amplifier that receives a pre-amplifier signal and outputs an amplified light signal, the pre-amplifier signal having a varying amplitude and a varying frequency, the system output signal and the reference signal including light from the amplified light signal;

electronics configured to operate the amplifier in a saturated state during a period of time when the amplifier outputs the amplified light signal; and a LIDAR chip configured to guide an outgoing LIDAR signal, the system output signal including light from the outgoing LIDAR signal, the amplifier being included on an amplifier chip, and the amplifier chip being included on the LIDAR chip and being positioned in a recess on the LIDAR chip such that the recess does not surround lateral sides of the amplifier chip.

16. A LIDAR system, comprising:
one or more optical components configured to output a system output signal that travels away from the LIDAR system and can be reflected by an object located outside of the LIDAR system such that light reflected from the object returns to the LIDAR system as a system return signal, the optical components configured to combine light from the system return signal with light from a reference signal, the reference signal including light that has not exited from the LIDAR system; and the LIDAR system including an amplifier that receives a pre-amplifier signal and outputs an amplified light signal, the pre-amplifier signal having a varying amplitude and a varying frequency, the system output signal and the reference signal including light from the amplified light signal; and electronics configured to operate the amplifier in a saturated state during a period of time when the amplifier outputs the amplified light signal; and a LIDAR chip configured to guide an outgoing LIDAR signal, the system output signal including light from the outgoing LIDAR signal, the amplifier being included on an amplifier chip, and the amplifier chip being included on the LIDAR chip and being positioned in a recess on the LIDAR chip such that the recess does not surround lateral sides of the amplifier chip.

17. The system of claim 1, wherein the amplifier chip includes an amplifier waveguide defined in a gain medium, the amplifier waveguide being aligned with a utility waveguide on the LIDAR chip.

18. The system of claim 4, wherein the amplifier chip includes an amplifier waveguide defined in a gain medium, the amplifier waveguide being aligned with a utility waveguide on the LIDAR chip.

19. The system of claim 15, wherein the LIDAR chip is constructed such that the reference signal includes light from the amplified light signal.

20. The system of claim 16, wherein the LIDAR chip is constructed such that the reference signal includes light from the amplified light signal.

* * * * *